(12) United States Patent
Yanagida et al.

(10) Patent No.: US 12,443,101 B2
(45) Date of Patent: Oct. 14, 2025

(54) CURED COATING FILM

(71) Applicant: TAIYO HOLDINGS CO., LTD., Saitama-ken (JP)

(72) Inventors: Nobuyuki Yanagida, Saitama-ken (JP); Kazuya Sato, Saitama-ken (JP); Mariko Shimamiya, Saitama-ken (JP); Yasuaki Arai, Saitama-ken (JP)

(73) Assignee: TAIYO HOLDINGS CO., LTD., Saitama-ken (JP)

( * ) Notice: Subject to any disclaimer, the term of this patent is extended or adjusted under 35 U.S.C. 154(b) by 711 days.

(21) Appl. No.: 17/764,641

(22) PCT Filed: Sep. 29, 2020

(86) PCT No.: PCT/JP2020/037011
§ 371 (c)(1),
(2) Date: Mar. 29, 2022

(87) PCT Pub. No.: WO2021/065950
PCT Pub. Date: Apr. 8, 2021

(65) Prior Publication Data
US 2022/0390844 A1    Dec. 8, 2022

(30) Foreign Application Priority Data
Sep. 30, 2019    (JP) .................. 2019-181054

(51) Int. Cl.
*G03F 7/038* (2006.01)
*C09D 5/18* (2006.01)
(Continued)

(52) U.S. Cl.
CPC ............ *G03F 7/0385* (2013.01); *C09D 5/18* (2013.01); *C09D 163/10* (2013.01); *G03F 7/004* (2013.01)

(58) Field of Classification Search
CPC ......... G03F 7/0385; G03F 7/028; G03F 7/004
See application file for complete search history.

(56) References Cited

U.S. PATENT DOCUMENTS 5,753,722 A * 5/1998 Itokawa .................. G03F 7/027
522/146
6,331,582 B1 * 12/2001 Chen .................... C09D 167/00
523/400
(Continued)

FOREIGN PATENT DOCUMENTS

CN       1446371 A       10/2003
JP       09157574 A  *   6/1997   ......... C08G 59/1494
(Continued)

OTHER PUBLICATIONS

International Search Report issued Dec. 22, 2020 in PCT/JP2020/037011, 2 pages.
(Continued)

*Primary Examiner* — Mark F. Huff
*Assistant Examiner* — Anna Malloy
(74) *Attorney, Agent, or Firm* — Element IP, PLC

(57) ABSTRACT

A matte-like cured coating film of a curable resin composition is provided on a substrate such as a wiring board, in which scratches are unnoticeable. The cured coating film satisfies Gs (20°)≤5 and Gs (85°)≥35 and has a ratio R represented by the formula R={Gs (85°)/Gs (60°)}/{Gs (60°)/Gs (20°)} ranging from 0.35 to 4.0, where Gs (20°), Gs (60°), and Gs (85°) are 20° gloss, 60° gloss, and 85° gloss on a surface of the cured coating film measured according to JIS Z 8741-1997, respectively.

4 Claims, 5 Drawing Sheets

(51) Int. Cl.
C09D 163/10 (2006.01)
G03F 7/004 (2006.01)

(56) References Cited

U.S. PATENT DOCUMENTS

| | | | | |
|---|---|---|---|---|
| 2002/0114934 | A1* | 8/2002 | Liu | C09D 4/00 |
| | | | | 427/372.2 |
| 2017/0299778 | A1* | 10/2017 | Kajiya | G02B 1/118 |
| 2022/0390844 | A1* | 12/2022 | Yanagida | C08G 65/3322 |

FOREIGN PATENT DOCUMENTS

| | | | |
|---|---|---|---|
| JP | H09-157574 | A | 6/1997 |
| JP | 2004109421 | A | 4/2004 |
| JP | 2004359639 | A | 12/2004 |
| JP | 2005097141 | A | 4/2005 |
| JP | 2005220097 | A | 8/2005 |
| JP | 2006160634 | A | 6/2006 |
| JP | 2008094770 | A | 4/2008 |
| JP | 2008509967 | A | 4/2008 |
| JP | 2009040762 | A | 2/2009 |
| JP | 2011080036 | A | 4/2011 |
| JP | 2016027363 | A | 2/2016 |
| JP | 3215657 | U | 4/2018 |
| JP | 2019061224 | A | 4/2019 |
| WO | WO-2002012404 | A2 | 2/2002 |
| WO | WO-2016011116 A1 * | | 1/2016 ........... C09D 11/101 |

OTHER PUBLICATIONS

Office Action issued Jun. 4, 2021 in Japanese Patent Application No. 2021-520240 (with English translation), 4 pages.
Combined Taiwanese Office Action and Search Report issued Nov. 21, 2022 in Patent Application No. 109134195 (with English translation), 18 pages.
English translation of the International Preliminary Report on Patentability and Written Opinion issued Apr. 14, 2022 in PCT/JP2020/037011, 5 pages.
Taiwanese Office Action issued Oct. 25, 2023 in corresponding Taiwanese Patent Application No. 112132449 (with machine English translation), 24 pages.
Combined Chinese Office Action and Search Report issued Feb. 6, 2025, in corresponding Chinese Patent Application No. 202080068796.8 (with machine English translation), 14 pages.

* cited by examiner

AFTER DEVELOPMENT

CURED COATING FILM

BACKGROUND OF THE INVENTION

Field of the Invention

The present invention relates to a cured coating film, particularly to a cured coating film that can be suitably used as a solder resist layer of printed wiring board or the like.

Background Art

In printed wiring boards used for electronic apparatuses, when electronic components are mounted on the printed wiring board, a solder resist layer is generally formed on the board on which a circuit pattern is created for the purpose of preventing soldering from adhering to components other than necessary components.

Recently, printed wiring boards have become more precise and denser due to the miniaturization of electronic apparatuses. Associated with this, it is currently mainstream that a solder resist layer is formed by a so-called photosensitive solder resist ink, wherein a curable resin composition is applied onto a base material and dried; pattern formation is carried out by exposure and development; and then a resin after the pattern formation is subjected to final curing by heating or light irradiation.

In addition, the use of a curable dry film (hereinafter, referred to as dry film) has also been carried out, wherein the solder resist layer is formed without using the above liquid curable resin composition. The dry film is characterized in that it can omit the drying step compared with using the liquid curable resin composition described above. In addition, because the exposure can be carried out in a state where the curable resin composition is covered by the supporting film, the influence of oxygen to inhibit the curing is smaller; and the obtained solder resist layer exhibits a higher surface smoothness and a higher surface hardness.

Meanwhile, it has been known that, by subjecting a solder resist layer to surface roughening, the solder adhesion resistance at the time of flow soldering and wiring concealment improve. In addition, the solder resist layer subjected to surface roughening has a moderately low gloss, thereby obtaining good design properties. Further, in recent years, in a board for an IC package, surface roughening of a solder resist layer has been carried out for the purpose of improving the filling property of underfill and the adhesion with a mold material. For example, Patent Literature 1 proposes surface roughening a solder resist layer by adding a filler to a photosensitive resin composition. Further, Patent Literature 2 suggests that surface roughening of a solder resist layer can be carried out by using a supporting film having a surface in contact with the photosensitive resin layer having a given surface roughness.

PRIOR ART DOCUMENTS

Patent Documents

Patent Document 1: JPH09-157574 A1
Patent Document 2: JP 2016-027363 A1 SUMMARY OF THE INVENTION

Technical Problem

However, in the matte solder resist layer having a roughened surface formed by the methods proposed in Patent Literature 1, 2, and the like, the depressed portion is visually recognized as a scratch when pressed with a strong force, which is a new problem that has arisen. In other words, in a printed wiring board provided with a matte solder resist layer, if the solder resist layer is accidentally scraped with a claw or the like during the manufacturing process, claw marks remain on the solder resist layer, and the quality and yield of the printed wiring board deteriorate, which is another new problem that has arisen.

The present invention has been made in view of the above problems. An object of the present invention is to provide a method of realizing a matte-like cured coating film in which scars are unnoticeable and improving product quality and yield even when scratches are inevitably generated during the manufacturing process. In other words, the object is to provide a matte-like cured coating film that is provided on a substrate such as a wiring board, in which scratches are unnoticeable.

Solution to Problem

While examining the appearance of scratches intentionally made on various surface-roughened cured coating films, the present inventor noticed that scratches could be made unnoticeable depending on the condition of the roughened surface. Then, the inventors further examined the cause in more detail and obtained findings that when the light incident on a cured coating film is reflected on the surface of the cured coating film, even if the gloss is not low with respect to the incident light from all directions, a good matte feeling can be obtained as long as the gloss for light incident on the coating film surface at a shallow angle is low, and a matte-like cured coating film in which scratches are unnoticeable can be realized as long as the surface morphology has a certain gloss with respect to light incident at a deep angle. The present invention is based on such findings. That is, the gist of the present invention is as follows.

[1] A cured coating film of a curable resin composition formed on a substrate, when 20° gloss, 60° gloss, and 85° gloss on a surface of the cured coating film measured according to JIS Z 8741-1997 are defined as Gs (20°), Gs (60°), and Gs (85°), respectively, $Gs(20°) \leq 5$, $Gs(85°) \geq 35$, and the ratio R represented by the following formula being 0.35 to 4.0:

$R = \{Gs(85°)/Gs(60°)\}/\{Gs(60°)/Gs(20°)\}$.

[2] The cured coating film according to [1], wherein the Gs (60°) is 2 to 30.

[3] The cured coating film according to [1] or [2], wherein the curable resin composition is a photosensitive resin composition.

[4] The cured coating film according to [3], wherein the curable resin composition comprises at least an alkali-soluble resin, a photopolymerizable monomer, and a photoinitiator.

[5] The cured coating film according to any one of [1] to [4], which is used as a solder resist layer of a printed wiring board.

Advantageous Effects of Invention

According to the present invention, it is possible to realize a matte-like cured coating film in which scratches are unnoticeable by obtaining a cured coating film in which Gs (85°)≥0.35 and the surface glosses of Gs (20°), Gs (60°), and Gs (85°) satisfy a specific relationship. In particular, it can be suitably realized as a cured coating film for a solder resist. Therefore, for example, even in a case where scratches or the like are inevitably made during the manufacturing process of a printed wiring board or the like, such scratches are unlikely to be visually recognized as damage, and therefore, product quality and yield can be improved.

DETAILED DESCRIPTION OF THE INVENTION

[Cured Coating Film]

Figure 1:
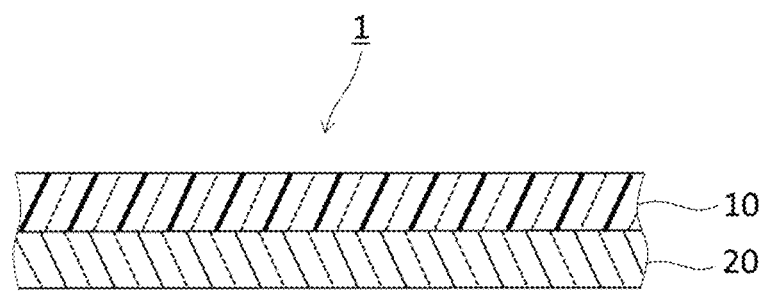
FIG. 1 is a schematic cross-sectional view showing one embodiment of the dry film according to the present invention.

The cured coating film of the present invention is characterized in that when a 20° gloss is Gs (20°), a 60° gloss is Gs (60°), and an 85° gloss is Gs (85°), each of which is measured according to JIS Z 8741-1997 for the surface of the cured coating film, $Gs(20°) \leq 5$, $Gs(85°) \geq 35$, and the ratio R represented by the following formula is 0.35 to 4.0:

$R = \{Gs(85°)/Gs(60°)\}/\{Gs(60°)/Gs(20°)\}$.

It was found according to the present invention that when a large number of cured coating films having various surface morphologies were prepared and subjected to gloss measurement, a cured coating film that satisfies the above relationship can be a matte-like cured coating film in which scratches are unnoticeable. Scratches are particularly noticeable in a cured coating film having Gs (85°)<35 even when R is in a range of 0.35 to 4.0. Further, even in a case where a cured coating film satisfies Gs (85°)≥35, when Gs (20°)>5 or R is out of the range of 0.35 to 4.0, in particular, a matte feeling cannot be obtained. In other words, it was difficult to achieve both a matte feeling and unnoticeable scratches. The reason for this is unclear, but it is thought to be as follows.

Usually, a cured coating film having a low gloss can be regarded as having a good matte feeling when visually recognized. However, not only the cured coating film having a low gloss in the entire range of incident angles of light has a matte feeling, but also the cured coating film having a low gloss when light is incident at a relatively shallow angle (the incident angle is about 0° to 60°) can also have a comparable matte feeling. Further, since the coating film surface has a low gloss, it is considered that scratches on the surface such as scratch marks become unnoticeable. Meanwhile, even in a case where the gloss when light is incident at a relatively deep angle (the incident angle is about 60° to 90°) is more than a certain level, it is considered that scratches on the cured coating film become difficult to visually recognize. Furthermore, it was found that when R is within a specific range, both a matte feeling and unnoticeable scratch marks are highly compatible.

In the present invention, the gloss can be measured according to JIS Z 8741-1997. A specific method of measuring a gloss will be described by taking the 60-degree gloss as an example. As a premise, on a surface having a refractive index of 1.567, when the incident angle is 60°, the intensity of light having a reflectance of 10% is assumed to be 100, and the intensity of light having a reflectance of 0% is assumed to be 0. As a result, a value of 1/100 of the intensity of light having a reflectance of 10% corresponds to a gloss of 1. The intensity of light on the surface of a cured coating film provided on a substrate is measured using a reflectance meter with a geometric condition of an incident angle of 60°. Then, the gloss is calculated by dividing the obtained light intensity by a value of 1/100 of the above light intensity having a reflectance of 10%. Simply, a digital variable angle gloss meter (Micro-Tri-Gloss manufactured by BYK-Gardener Gmbh) can be used to measure the gloss at each angle of the surface of the cured coating film provided on the substrate. The "20-degree gloss (Gs (20°))" is the value of gloss when the measurement conditions include: incident angle=20° and light-receiving angle=20°. Similarly, the "60-degree gloss (Gs (60°))" is the value of gloss when the incident angle is 6° and the light-receiving angle is 60°, and the "85-degree gloss (Gs (85°))" is the value of gloss when the incident angle is 85° and the light-receiving angle is 85°. Here, the cured coating film refers to a coating film in which the curable resin layer of the dry film is cured by performing at least one of photo-curing and heat-curing. Further, it can be confirmed by the following method whether or not the cured coating film is formed. In other words, a waste cloth containing isopropyl alcohol (IPA) is placed on the surface of the cured coating film in an environment of 25° C. and 50% RH. Further, a weight of 500 g is placed thereon and allowed to stand for one minute, following which the waste cloth is removed. A state in which all or part of the resin layer is not attached to the surface of the waste cloth in contact with the cured coating film is judged to be a "cured state."

From the viewpoint of more preferably maintaining the matte feeling of the cured coating film, the Gs (20°) of the cured coating film is preferably 4 or less and more preferably 3.5 or less.

On the other hand, from the viewpoint of making scratches unnoticeable, the Gs (85°) of the cured coating film is preferably 40 or more and more preferably 50 or more.

Further, from the viewpoint of the matte feeling and the unnoticeableness of scratches, the preferable range of the ratio R represented by the above formula is 0.4 to 2.0, the more preferable range is 0.45 to 1.0, and the particularly preferable range is 0.50 to 0.65.

From the viewpoint of more preferably maintaining the matte feeling of the cured coating film, the Gs (60°) is more preferably in a range of 2 to 30, still more preferably in a range of 5 to 30, particularly preferably in a range of 10 to 25, and most preferably in a range of 15 to 20.

[Method of Forming Cured Coating Film]

The cured coating film of the present invention can be formed by applying a curable resin composition on a substrate, drying it, and then curing the curable resin composition with either or both light and heat. Further, the curable resin composition may be cured by exposure and development to form a patterned coating cured film. A cured coating film may be formed by preparing a dry film having a curable resin layer formed by applying a curable resin composition to a supporting film and drying it, attaching the dry film to a substrate such that the substrate and the curable resin layer are in contact with each other, photo-curing or heat-curing the curable resin layer, and then detaching the supporting film. A cured coating film may also be formed by attaching the dry film to a substrate such that the substrate and the curable resin layer are in contact with each other, detaching the supporting film before and after exposure, and then curing the curable resin layer through development.

It is considered that the cured coating film having a specific gloss as described above has a specific surface morphology that is not imparted to conventional cured coating films. In other words, conventional matte-like cured coating films having a roughened surface were formed by imparting a prescribed roughness morphology to the surface, but the cured coating film of the present invention is considered to have a morphology including not only an uneven portion but also a certain flat portion. Such a cured coating film having a surface morphology including an uneven portion and a certain flat portion may be produced by incorporating a prescribed surface morphology to the surface of the dry coating film of the curable resin composition using a transfer roller or the like or by using a dry film obtained by applying a curable resin composition to a supporting film having a surface that has been processed into a specific shape in advance and drying it. Alternatively, an excellent cured coating film can be produced more easily and conveniently by the following method. Hereinafter, a method of preferably producing a cured coating film as described above will be described.

[Dry Film]

The cured coating film of the present invention can be obtained by photo-curing or heat-curing a curable resin layer using a dry film, or by curing a curable resin layer by exposure or development. A dry film that can be suitably used will be described below with reference to the drawings.

Figure 2:
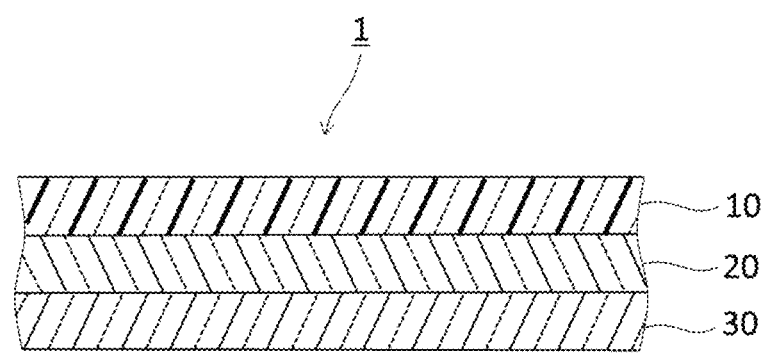
FIG. 2 is a schematic cross-sectional view showing another embodiment of the dry film according to the present invention.

FIG. 1 is a schematic cross-sectional view showing one embodiment of the dry film that can be suitably used for producing the cured coating film of the present invention. A dry film 1 has a structure in which a supporting film 10 and a curable resin layer 20 formed of a curable resin composition are laminated in this order. Here, the curable resin layer is a layer obtained by forming a coating of the curable resin composition and drying it, on which other layers such as a supporting film and a protective film are not laminated in advance. Further, in the present invention, another film or the like may be provided in addition to the above components. For example, for the purpose of preventing dust and the like from adhering to the surface of the curable resin layer 20 of the dry film 1 and with consideration for the ease of handling of the dry film 1, a protective film 30 may further be provided on the side of the dry film 1 opposed to the side that is in contact with the supporting film 10 of the curable resin layer 20 as shown in FIG. 2. Each of the components that compose the dry film will be described below. Here, the supporting film in the present invention refers to a film that is adhered to at least the curable resin layer when carrying out laminating such that the curable resin layer side of the dry film is in contact with the substrate such as a wiring board. The supporting film may be detached from the curable resin layer in the step after laminating. Meanwhile, the protective film in the present invention refers to a film that is detached from the curable resin layer before laminating when carrying out laminating such that the curable resin layer side of the dry film is in contact with the substrate such as a wiring board and molding.

[Supporting Film]

Figure 3:
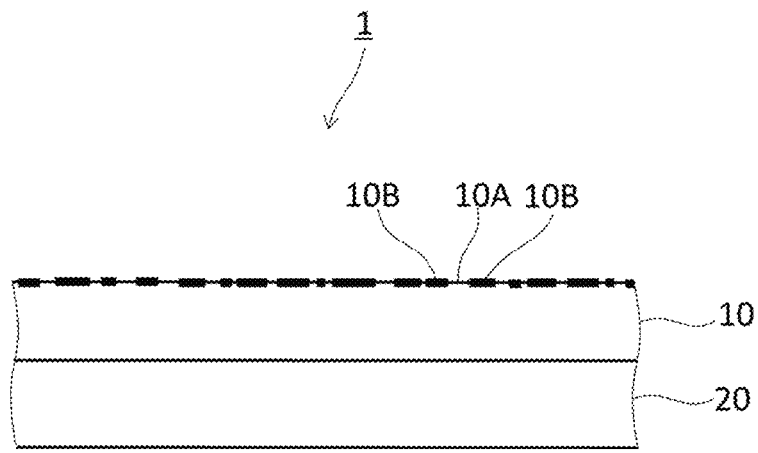
FIG. 3 is a schematic cross-sectional view showing one embodiment of the dry film for illustrating a light-shielding portion.

As shown in FIG. 3, the supporting film 10 used for the dry film 1 has a light-shielding portion 10B formed on at least one side of the light-transmitting supporting film 10. In other words, at least one side of the supporting film is provided with a light-shielding portion 10B and a light-transmitting portion 10A through which light passes between adjacent light-shielding portions 10B. The light-shielding portion 10B has a dot-array morphology such that light incident from one side of the supporting film 10 (exposure light) is diffracted when emitted from the other side to generate interference fringes.

Figure 4:
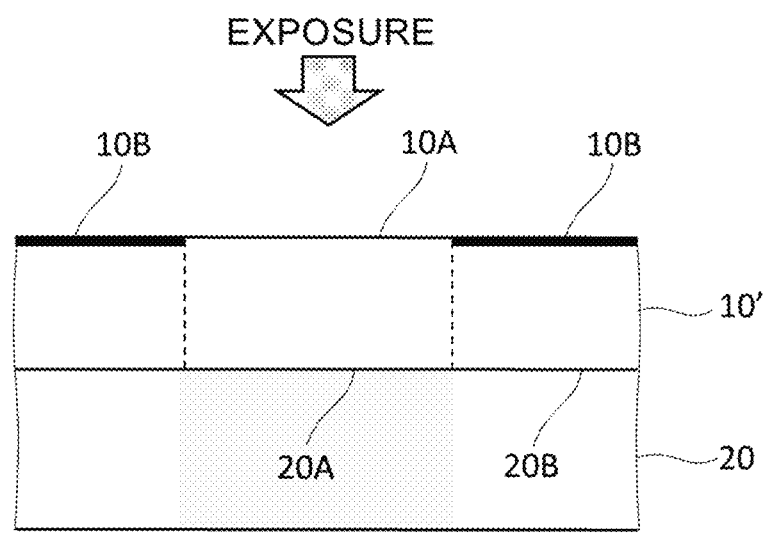
FIG. 4 is a schematic cross-sectional view showing one embodiment of a dry film for explaining the action of exposure light when diffraction does not occur, and a cured coating film obtained by using the dry film.
Figure 4:
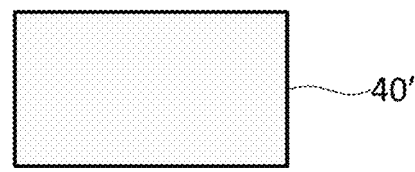
Figure 5:
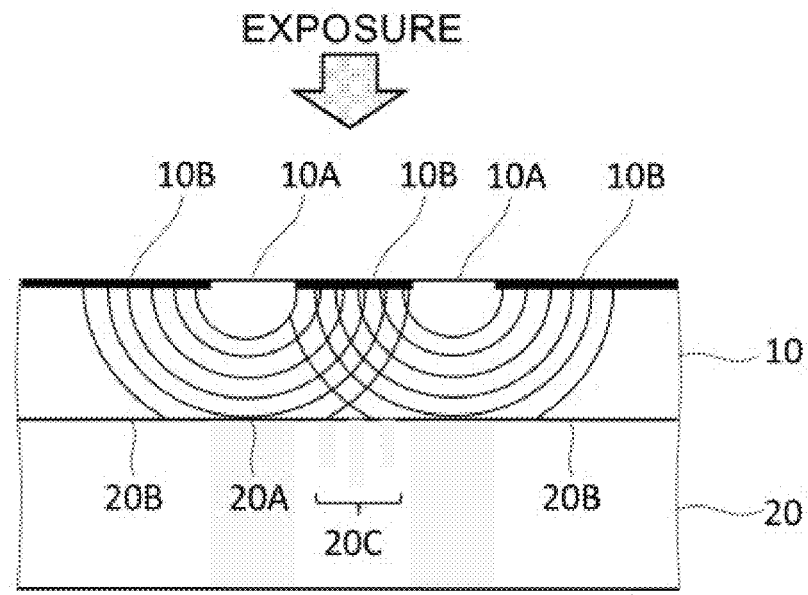
FIG. 5 is a schematic cross-sectional view showing one embodiment of a dry film for explaining the action of exposure light when diffraction occurs, and a cured coating film obtained by using the dry film.
Figure 5:
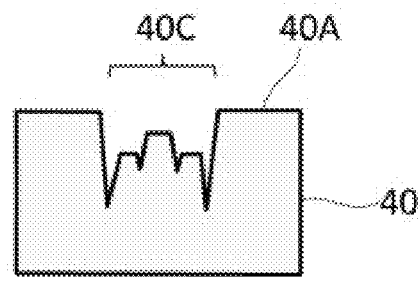

In a case where the distance between the adjacent light-shielding portions 10B (i.e., the width of the light-transmitting portion 10A) is large, as shown in FIG. 4, the light (exposure light) incident from one side of a supporting film 10' is emitted from the opposite side of the film supporting 10' without being diffracted. Therefore, when exposure is performed from the supporting film 10' side of the dry film to develop the curable resin layer 20, the portion corresponding to the width of the light-shielding portion 20B is removed such that only the portion corresponding to the width of the light-transmitting portion 10A is formed as a cured coating film 40'. Meanwhile, in a case where a light-shielding portion 10B is provided such that when the light incident on the supporting film 10 is emitted from the other side, it is diffracted to generate interference fringes, as shown in FIG. 5, the light incident from the light-transmitting portion 10A is diffracted such that lights passing through adjacent light-transmitting portions 10A interfere with each other, thereby generating interference fringes 20C. In other words, there are a portion 20A that is irradiated with light according to the width of light-transmitting portion 10A, a portion 20B that is not irradiated with light according to the width of light-shielding portion 10B, and a portion 20C having generated interference fringes on the surface of the curable resin layer 20. Therefore, when exposure is performed from the supporting film 10 side of the dry film 10 to develop the curable resin layer 20, as the degree of removal of the curable resin layer 20 (curable resin composition) at the time of development is different in the portion 20C where the intensity of the exposure light varies (interference fringes), a flat portion 40A and an uneven portion 40C are formed on the surface of a cured coating film 40.

The light-shielding portion 10B does not mean that the light transmittance is 0, but it means that the light transmittance is lower than the light transmittance of the light-transmitting portion 10A (light is difficult to transmit). Therefore, in a case where the supporting film 10 is transparent, the light-shielding portion 10B may have a low light transmittance like that of a black color, or may have a light transmittance like that of a gray color or a chromatic color which is lower than that of a transparent color. Further, it is not necessary that all light-shielding portions have the same transmittance, and each light-shielding portion provided in a dot array may have a different transmittance. From the viewpoint of the ease of manufacture of the dry film, it is preferable that the light-shielding portion is black.

As will be described later, the curable resin layer 20 has a portion that is not exposed (a portion where the curable resin layer has not been cured) is removed by post-exposure development. In conventional dry films and the like, the light emitted from the opening portion of the mask during exposure is intended to expose the curable resin layer via the supporting film. Thus, the light emitted from the opening portion of the mask uniformly irradiates the surface of the curable resin layer. Accordingly, the cured coating film formed through development had a smooth and uniform surface morphology. Meanwhile, as described above, the dry film used in producing the cured coating film of the present invention is provided with a dot array-shaped light-shielding portion such that when light incident on at least one side of the supporting film is emitted from the other side, the light is diffracted to generate interference fringes. Thus, as shown in FIG. 5, the intensity of the light irradiating the curable resin layer varies.

The light (exposure light) incident on the curable resin layer 20 has a difference in light intensity unlike the case of the conventional dry films. Therefore, when development is performed, the amount of curable resin composition removed also varies depending on the difference in the intensity of irradiating light. In other words, the stronger the intensity of exposure light, the smaller the amount of the curable resin composition removed during development, and conversely, the weaker the intensity of exposure light, the larger the amount of the curable resin composition removed during development. As a result, as shown in FIG. 5, a cured coating film 40 obtained by detaching the supporting film 10 from the curable resin layer 20 after exposure and performing post-exposure development (i.e., a coating film obtained by curing the curable resin layer 20) has a complicated surface morphology including a flat portion 40A and an uneven portion 40C.

Figure 6:
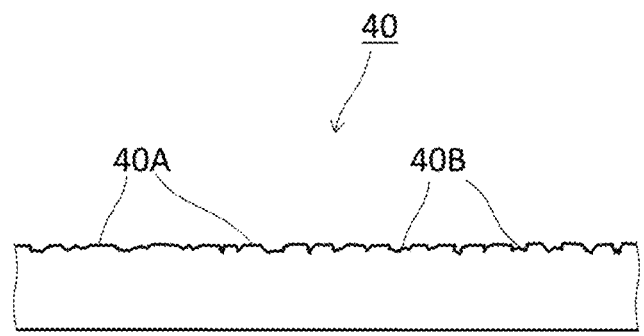
FIG. 6 is a schematic cross-sectional view showing one embodiment of a cured coating film obtained by using the dry film according to the present invention.

The surface of a conventional matte solder resist layer of a cured coating film is roughened such that light is scattered; however, when the solder resist layer is rubbed with a nail or the like, the nail marks will remain in the solder resist layer, which has been a problem. It is thought that this is because the roughness morphology formed when the surface of the solder resist layer is roughened is deformed by scratching by a nail or the like, thereby causing a flat surface to be formed locally, and thus such a flat portion is visually recognized as a scratch (nail mark). On the other hand, according to the dry film that can be suitably used when producing the cured coating film of the present invention, as shown in FIG. 6, the surface of the cured coating film has an uneven portion while leaving a certain flat portion (the difference in the film thickness of the cured coating film). It is therefore thought that even when scratches are made, the scratches are unnoticeable, although the cured coating film is a matte-like cured coating film.

The light-shielding portion 10B of the supporting film 10 may be formed to have a dot-array morphology such that light incident from one side of the supporting film 10 (exposure light) is diffracted when emitted from the other side to generate interference fringes. Although the morphology or size is not particularly limited, in order to generate interference fringes, in a case where the width of each light-shielding portion is d (μm), $d \times \sin \theta = m\lambda$ (where m is an integer greater than or equal to 0 and θ is the diffraction angle) must be satisfied. In a case where ultraviolet light (wavelength: 200 to 300 nm) is used as the exposure light, by forming the light-shielding portion 10B such that the distance between adjacent dots is preferably 0.5 to 50 μm, interference fringes can be generated in the exposure light incident from the supporting film side. More preferably, the distance between adjacent dots 1.0 to 25 μm.

Figure 8:
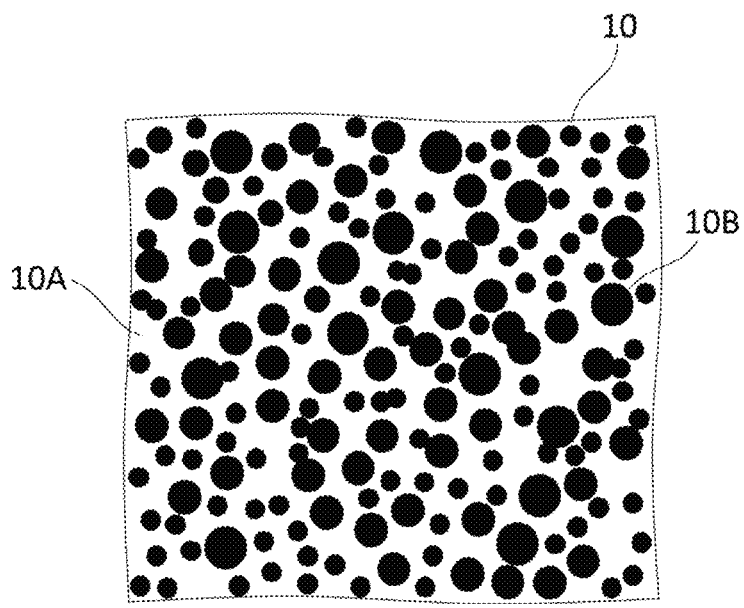
FIG. 8 is a schematic cross-sectional view showing another embodiment of the dry film for illustrating a light-shielding portion.

In one embodiment of the present invention, the non-light-transmitting portion formed on at least one side of the supporting film is preferably composed of plural dot shapes. The dots may have the same size or different sizes. In addition, the adjacent dots do not necessarily have to be separated by a certain distance, and some of them may overlap each other. For example, as shown in FIG. 8, the light-shielding portion 10B may be composed of plural circular dots having different diameters. In this case, it goes without saying that the portion other than the dots 10B becomes the light-transmitting portion 10A. Although not shown, the dot shape does not have to be circular, and may be any shape such as an ellipse or a rectangle.

In the light-shielding portion, interference fringes can be generated in the exposure light incident on the supporting film by forming dots such that the adjacent dots are separated at certain intervals as described above. In addition to that, in order to effectively form the interference fringes, not only the distance between the adjacent dots but also the dot size is important. In other words, in the present invention, the area ratio of the light-shielding portion to the entire supporting film is preferably 10% to 90%, more preferably 25% to 75%, and particularly preferably 35% to 60%. When the area ratio of the light-shielding portion to the entire supporting film is increased, the exposure amount required to cure the curable resin layer may be insufficient.

Further, from the viewpoint of forming a matte-like cured coating film in which scratches are unnoticeable, the size of each dot when the shape of the light-shielding portion 10B is a circular dot is preferably 1 to 50 μm, more preferably 2 to 25 μm, and particularly preferably 4 to 12 μm in diameter.

Figure 7:
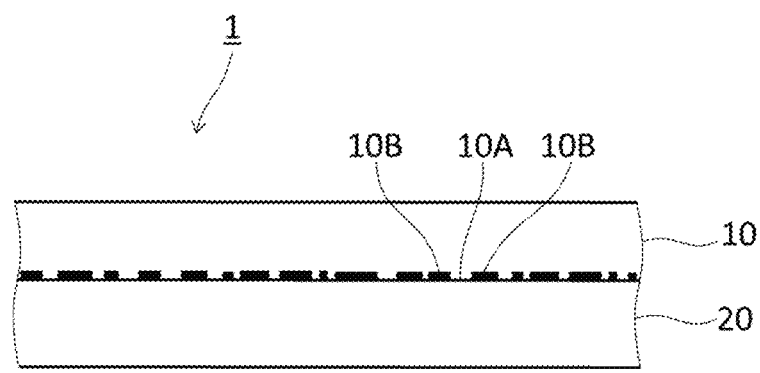
FIG. 7 is a plan view showing one embodiment of the shape of a light-shielding portion in a supporting film.

The light-shielding portion 10B can be formed on one side of the support film 10. Alternatively, as shown in FIG. 3, the light-shielding portion 10B may be provided on the side (light irradiation side) opposite to the side on which the curable resin layer 20 is provided, or as shown in FIG. 7, the light-shielding portion 10B may be provided on the side of the supporting film 10 on which the curable resin layer 20 is provided. From the viewpoint of forming a matte-like cured coating film in which scratches are unnoticeable, it is preferable to provide the light-shielding portion 10B on the side (light irradiation side) opposite to the side on which the curable resin layer 20 is provided. In this case, from the viewpoint of efficiently forming interference fringes and forming a matte-like cured coating film in which scratches are unnoticeable, the thickness of the supporting film is preferably 10 to 150 μm and more preferably 15 to 100 μm.

In order to form a light-shielding portion on the supporting film, a light-shielding portion can be formed on the surface of a light-transmitting supporting film by using vapor deposition etching, a gravure offset method, photo-patterning, or the like.

As the supporting film, any material having light transmittance can be used without particular limitation. In the present invention, the supporting film having light transmittance is not limited to those having a light transmittance of 100%, and it may have a certain light transmittance. In a case where the light transmittance of the supporting film is low, it is necessary to increase the irradiation intensity of the exposure light when forming a cured coating film by using a dry film. Considering that normal intensity exposure light can be used when using a dry film (i.e., when forming a cured coating film) or the ease of processing and the convenience of handling, as the supporting film, films composed of thermoplastic resins such as polyester films of polyethylene terephthalate or polyethylene naphthalate, polyimide films, polyamide-imide films, polypropylene films, and polystyrene films can be suitably used. Of these, polyester films can be suitably used from the viewpoint of transparency, thermal resistance, mechanical strength, the ease of handling, and the like.

In addition, for the purpose of improving the strength, Films stretched in a uniaxial direction or a biaxial direction are preferably used as the thermoplastic resin film described above.

Further, from the viewpoint of forming a matte-like cured coating film, it is preferable to use a supporting film having a roughened surface. Examples of the supporting film having a roughened surface can include those formed by adding a filler in a resin at the time of film formation or subjecting the film surface to blasting, hairline processing, matte coating, chemical etching or the like.

An anti-sticking treatment may be performed on the side of the supporting film provided with the curable resin layer. For example, a coating liquid prepared by dissolving or dispersing an anti-sticking agent such as a wax, a silicone wax, a silicone-based resin into an appropriate solvent can be applied on and dried the surface of the supporting film by a coating method such as a roll coating method, a spray coating method or a known means such as a gravure printing method or a screen printing method, thereby performing the anti-sticking treatment.

Further, after coating on the supporting film, the coated surface is exposed and developed using a negative film having the above dot array-like pattern on the surface. The thus obtained supporting film can be preferably used. Thereafter, by adhering the supporting film to the curable resin layer, the surface morphology of the supporting film is incorporated to the curable resin layer such that a desired cured coating film can be obtained.

In particular, in a case where the curable resin layer is not photosensitive but thermosetting or photocurable, it can be preferably used.

[Curable Resin Layer]

In a case where the curable resin layer provided on at least one side of the supporting film is photosensitive, it is subjected to patterning by exposure and development of the dry film to be a cured coating film (solder resist layer) provided on the circuit board. To form such a curable resin layer, a curable resin composition, for example, a conventionally known solder resist ink or the like can be used without limitation. An example of a curable resin composition that can be preferably used to form the curable resin layer of the dry film according to the present invention will be described below.

In the present invention, the curable resin composition preferably contains at least an alkali-soluble resin, a photopolymerizable monomer, and a photoinitiator when imparting photosensitivity. Hereinafter, each component constituting the curable resin composition will be described.

The alkali-soluble resin is a component that is cured via polymerization or crosslinking by light irradiation, and as it has the alkaline development property, it can form a cured coating film in the desired pattern by exposure and development. As the alkali-soluble resin, various conventionally known photosensitive resins having a carboxyl group in the molecule can be preferably used. As the curable resin composition contains a carboxyl group-containing resin, the alkaline development property can be imparted to the curable resin composition. A carboxyl group-containing photosensitive resin having a (meth)acryloyl group in the molecule is particularly preferable from the viewpoint of photocurability and development resistance. The (meth)acryloyl group is preferably derived from acrylic acid or methacrylic acid or a derivative thereof. In a case where only a carboxyl group-containing resin having no (meth)acryloyl group is used, it is required to be used in conjunction with a compound having plural ethylenically unsaturated groups in the molecule described later, i.e., a photopolymerizable monomer, for the purpose of making the composition photocurable. Specific examples of the carboxyl group-containing resin include compounds as described below (may be either oligomers or polymers). It is to be noted that the term (meth)acryloyl group, when used herein, is a generic term of an acryloyl group, a meta-acryloyl group, and a mixture thereof; and the same is hereinafter applied to other similar expressions.

(1) A carboxyl group-containing resin obtained by copolymerization of an unsaturated carboxylic acid such as (meth)acrylic acid with an unsaturated group-containing compound such as styrene, α-methylstyrene, lower alkyl (meth)acrylate, or isobuthylene.

(2) A carboxyl group-containing urethane resin obtained by a polyaddition reaction of a diisocyanate such as aliphatic diisocyanate, branched aliphatic diisocyanate, alicyclic diisocyanate, or aromatic diisocyanate, with a carboxyl group-containing dialcohol compound such as dimethylolpropionic acid or dimethylolbutanoic acid and a diol compound such as polycarbonate polyol, polyether polyol, polyester polyol, polyolefin polyol, acrylic polyol, bisphenol A alkylene oxide adduct diol, or a compound having a phenolic hydroxyl group and an alcoholic hydroxyl group.

(3) A carboxyl group-containing photosensitive urethane resin obtained by a polyaddition reaction of diisocyanate with (meta)acrylate of a bifunctional epoxy resin such as bisphenol A type epoxy resin, hydrogenated bisphenol A type epoxy resin, bisphenol F type epoxy resin, bisphenol S type epoxy resin, bixylenol type epoxy resin, or biphenol type epoxy resin or a partially modified acid anhydrid thereof, a carboxyl group-containing dialcohol compound, and a diol compound.

(4) A carboxyl group-containing photosensitive urethane resin obtained by adding a compound having one hydroxyl group and one or more (meth)acryloyl groups in the molecule such as hydroxyalkyl (meth)acrylate during synthesis of the resin in (2) or (3) above to be terminally (meth)acrylated.

(5) A carboxyl group-containing photosensitive urethane resin obtained by adding a compound having one isocyanate group and one or more (meth)acryloyl groups in the molecule such as equimolar reaction product of isophorone diisocyanate and pentaerythritol triacrylate during synthesis of the resin in (2) or (3) above to be terminally (meth)acrylated.

(6) A carboxyl group-containing photosensitive resin obtained by bringing a bifunctional (solid) epoxy resin or a (solid) epoxy resin with three or more functionalities into reaction with (meth)acrylic acid and adding a dibasic acid anhydride to the hydroxyl group present in a side chain.

(7) A carboxyl group-containing photosensitive resin obtained by bringing a multifunctional epoxy resin into reaction with (meth)acrylic acid and adding a dibasic acid anhydride to the generated hydroxyl group, which multifunctional epoxy resin is obtained by epoxidation of a hydroxyl group of bifunctional (solid) epoxy resin with epichlorohydrin.

(8) A carboxyl group-containing polyester resin obtained by bringing a bifunctional oxetane resin into reaction with dicarboxylic acid such as adipic acid, phthalic acid, or hexahydrophthalic acid and adding a dibasic acid anhydride such as phthalic anhydride, tetrahydrophthalic anhydride, or hexahydrophthalic anhydride to the generated primary hydroxyl group.

(9) A carboxyl group-containing photosensitive resin obtained by bringing an epoxy compound having plural epoxy groups in one molecule into reaction with a compound having at least one alcoholic hydroxyl group and one phenolic hydroxyl group in one molecule, such as p-hydroxyphenethyl alcohol, and an unsaturated group-containing monocarboxylic acid such as (meth)acrylic acid, and bringing the alcoholic hydroxyl group of the obtained reaction product into reaction with a polybasic anhydride such as maleic anhydride, tetrahydrophthalic anhydride, trimellitic anhydride, pyromellitic anhydride, or adipic acid.

(10) A carboxyl group-containing photosensitive resin obtained by bringing a compound having plural phenolic hydroxyl groups in one molecule into reaction with alkylene oxide such as ethylene oxide or propylene oxide; bringing the obtained reaction product into reaction with an unsaturated group-containing monocarboxylic acid; and bringing the obtained reaction product into reaction with a polybasic anhydride.

(11) A carboxyl group-containing photosensitive resin obtained by bringing a compound having plural phenolic hydroxyl groups in one molecule into reaction with a cyclic carbonate compound such as ethylene carbonate or propylene carbonate; bringing the obtained reaction product into reaction with an unsaturated group-containing monocarboxylic acid; and bringing the obtained reaction product into reaction with a polybasic anhydride.

(12) A carboxyl group-containing photosensitive resin obtained by further adding a compound having one epoxy group and one or more (meth)acryloyl groups in one molecule to the above resin in any of (1) to (11).

The alkali-soluble resin that can be used in the present invention is not limited to those listed above. In addition, one kind of the alkali-soluble resin listed above may be used alone, or two or more kinds may be mixed and used.

The weight average molecular weight of the alkali-soluble resin varies in resin backbone, and in general in a range of 2,000 to 150,000 and preferably in a range of 5,000 to 100,000. By using an alkali-soluble resin having a weight average molecular weight of 2,000 or more, resolution and tack-free performance can be improved. Further, by using an alkali-soluble resin having a weight average molecular weight of 150,000 or less, development properties and storage stability can be improved.

The amount of the alkali-soluble resin combined in the curable resin composition is preferably 20% to 60% by mass in the total composition. By making the amount 20% by mass or more, the coating film strength can be improved. In addition, by making the amount 60% by mass or less, an appropriate viscosity is attained and the processability improves. More preferably, the amount is 30% to 50% by mass.

The photopolymerizable monomer contained in the curable resin composition is a monomer having a photopolymerizable group consisting of a (meth)acryloyl group. Examples of such a photopolymerizable monomer include commonly used known polyester (meth)acrylate, polyether (meth)acrylate, urethane (meth)acrylate, carbonate (meth)acrylate, and epoxy (meth)acrylate. To be specific, at least one selected as appropriate from the following can be used: hydroxyalkyl acrylates such as 2-hydroxyethyl acrylate or 2-hydroxy propyl acrylate; diacrylates of glycol such as ethylene glycol, methoxytetra ethylene glycol, polyethylene glycol, or propylene glycol; acrylamides such as N,N-dimethyl acrylamide, N-methylolacrylamide, or N,N-dimethylamino propyl acrylamide; amino alkyl acrylates such as N,N-dimethylamino ethyl acrylate or N,N-dimethylamino propyl acrylate; polyacrylates such as polyalcohol such as hexanediol, trimethylolpropane, pentaerythritol, dipentaerythritol, or tris-hydroxyethyl isocyanurate, or an ethylene oxide adduct, propylene oxide adduct, or ε-caprolactone adduct thereof; polyacrylates such as phenoxy acrylate, bisphenol A diacrylate, and an ethylene oxide adduct or propylene oxide adduct of those phenols; polyacrylates of glycidyl ether such as glycerin diglycidyl ether, glycerin triglycidyl ether, trimethylolpropane triglycidyl ether, or triglycidyl isocyanurate; and, besides the above, acrylates obtained by subjecting polyols such as polyether polyol, polycarbonate diol, hydroxyl-terminated polybutadiene, or polyester polyol to direct acrylation or urethane acrylation via diisocyanate, and melamine acrylates; and each of methacrylates corresponding to the above-mentioned acrylates. Such a photopolymerizable monomer can also be used as a reactive diluent.

An epoxy acrylate resin obtained by bringing a polyfunctional epoxy resin such as a cresol novolak-type epoxy resin into reaction with acrylic acid, an epoxyurethane acrylate compound obtained by further bringing the hydroxyl group of the epoxy acrylate resin into reaction with a hydroxy acrylate such as pentaerythritol triacrylate and a halfurethane compound of diisocyanate such as isophorone diisocyanate, and the like may be used as the photopolymerizable monomer. Such an epoxy acrylate-based resin can improve the photocurability without decreasing the property of drying to set to touch.

The amount of the photopolymerizable monomer combined is preferably 0.2 to 60 parts by mass and more preferably 0.5 to 50 parts by mass based on 100 parts by mass of the alkali-soluble resin in terms of solid content. By making the amount of the photopolymerizable monomer 0.2 parts by mass or more, the photocurability of the curable resin composition improves. In addition, by making the amount 60 parts by mass or less, the hardness of the cured coating film can be improved.

The photoinitiator contained in the curable resin composition is for reacting the above alkali-soluble resin or photopolymerizable monomer by exposure. Any known photoinitiator can be used. One kind of photoinitiator may be solely used or two or more kinds may be used in combination.

Specific examples of the photoinitiator can include: bisacylphosphine oxides such as bis-(2,6-dichlorobenzoyl)phenylphosphine oxide, bis-(2,6-dichlorobenzoyl)-2,5-dimethylphenylphosphine oxide, bis-(2,6-dichlorobenzoyl)-4-propylphenylphosphine oxide, bis-(2,6-dichlorobenzoyl)-1-naphthylphosphine oxide, bis-(2,6-dimethoxybenzoyl)phenylphosphine oxide, bis-(2,6-dimethoxybenzoyl)-2,4,4-trimethylpentylphosphine oxide, bis-(2,6-dimethoxybenzoyl)-2,5-dimethylphenylphosphine oxide, and bis-(2,4, 6-trimethylbenzoyl)-phenylphosphine oxide; monoacylphosphine oxides such as 2,6-dimethoxybenzoyl diphenylphosphine oxide, 2,6-dichlorobenzoyl diphenylphosphine oxide, 2,4,6-trimethylbenzoyl phenylphosphinic acid methyl ester, 2-methylbenzoyl diphenylphosphine oxide, pivaloyl phenylphosphinic acid isopropyl ester, and 2,4,6-trimethylbenzoyl diphenylphosphine oxide; hydroxyacetophenones such as phenyl(2,4,6-trimethylbenzoyl)ethyl phosphinate, 1-hydroxy-cyclohexyl phenylketone, 1-[4-(2-hydroxyethoxy)-phenyl]-2-hydroxy-2-methyl-1-propane-1-one, 2-hydroxy-1-{4-[4-(2-hydroxy-2-methyl-propionyl)-benzyl]phen yl}-2-methyl-propane-1-one, and 2-hydroxy-2-methyl-1-phenylpropane-1-one; benzoins such as benzoin, benzyl, benzoin methyl ether, benzoin ethyl ether, benzoin n-propyl ether, benzoin isopropyl ether, and benzoin n-butyl ether; benzoin alkyl ethers; benzophenones such as benzophenone, p-methylbenzophenone, Michler's ketone, methylbenzophenone, 4,4'-dichlorobenzophenone, and 4,4'-bis-diethylaminobenzophenone; acetophenones such as acetophenone, 2,2-dimethoxy-2-phenylacetophenone, 2,2-diethoxy-2-phenylacetophenone, 1,1-dichloroacetophenone, 1-hydroxycyclohexyl phenylketone, 2-methyl-1-[4-(methylthio)phenyl]-2-morpholino-1-propanon, 2-benzyl-2-dimethylamino-1-(4-morpholinophenyl)-butanone-1, 2-(dimethylamino)-2-[(4-methylphenyl)methyl]-1-[4-(4-morpho linyl)phenyl]-1-butanone, and N,N-dimethylaminoacetophenone; thioxanthones such as thioxanthone, 2-ethyl thioxanthone, 2-isopropyl thioxanthone, 2,4-dimethyl thioxanthone, 2,4-diethyl thioxanthone, 2-chlorothioxanthone, and 2,4-diisopropyl thioxanthone; anthraquinones such as anthraquinone, chloroanthraquinone, 2-methylanthraquinone, 2-ethylanthraquinone, 2-tert-butylanthraquinone, 1-chloroanthraquinone, 2-amylanthraquinone, and 2-aminoanthraquinone; ketals such as acetophenone dimethyl ketal and benzyl dimethyl ketal; benzoic acid esters such as ethyl-4-dimethylaminobenzoate, 2-(dimethylamino)ethyl benzoate, and p-dimethylbenzoic acid ethyl ester; oxime esters such as 1,2-octanedione, 1-[4-(phenylthio)-,2-(O-benzoyloxime)], ethanone, 1-[9-ethyl-6-(2-methylbenzoyl)-9H-carbazole-3-yl]-,1-(0-acetyl oxime); titanocenes such as bis (η5-2,4-cyclopentadiene-1-yl)-bis(2,6-difluoro-3-(1H-pyrrole-1-yl)phenyl)titanium, bis(cyclopentadienyl)-bis[2,6-difluoro-3-(2-(1-pyl-1-yl)ethyl)phe nyl]titanium; and phenyldisulfide 2-nitrofluorene, butyroin, anisoisoethyl ether, azobisisobutyronitrile, and tetramethylthiuram disulfide.

Examples of commercially available α-aminoacetophenone-based photoinitiators include Omnirad 907, 369, 369E, and 379 manufactured by IGM Resins B.V. In addition, examples of commercially available acylphosphine oxide-based photoinitiators include Omnirad TPO H and 819 manufactured by IGM Resins B.V. Examples of commercially available oxime ester-based photoinitiators include: Irgacure OXE01 and OXE02 manufactured by BASF Japan Ltd.; N-1919, and Adeka Arkls NCI-831 and NCI-831E manufactured by ADEKA Corporation; and TR-PBG-304 manufactured by TRONLY.

Besides, examples include carbazole oxime ester compounds described in Japanese Patent Application Laid-Open Publication No. 2004-359639, Japanese Patent Application Laid-Open Publication No. 2005-097141, Japanese Patent Application Laid-Open Publication No. 2005-220097, Japanese Patent Application Laid-Open Publication No. 2006-160634, Japanese Patent Application Laid-Open Publication No. 2008-094770, Japanese Translated PCT Patent Application Laid-Open No. 2008-509967, Japanese Translated PCT Patent Application Laid-open No. 2009-040762, and Japanese Patent Application Laid-Open Publication No. 2011-80036.

The amount of the photoinitiator combined is preferably 0.1 to 20 parts by mass, more preferably 0.5 to 18 parts by mass, and still more preferably 1 to 15 parts by mass based on 100 parts by mass of the alkali-soluble resin in terms of solid content. In a case where the amount is 0.01 parts by mass or more, the photocurability of the resin composition becomes good, and the coating film characteristics such as chemical resistance also become good. Meanwhile, in a case where the amount is 20 parts by mass or less, light absorption on the surface of the resist film (cured coating film) improves and the deep curability does not easily decrease.

In conjunction with the above photoinitiator, a photoinitiation auxiliary agent or a sensitizer may be used. Examples of the photoinitiation auxiliary agent or the sensitizer can include a benzoin compound, an anthraquinone compound, a thioxanthone compound, a ketal compound, a benzophenone compound, a tertiary amine compound, and a xanthone compound. It is particularly preferable to use a thioxanthone compound such as 2,4-dimethyl thioxanthone, 2,4-diethyl thioxanthone, 2-chlorothioxanthone, 2-isopropyl thioxanthone, or 4-isopropyl thioxanthone. By containing the thioxanthone compound, the curability in deep portions can be improved. These compounds may in some cases be used as the photoinitiator but are preferably used in conjunction with the photoinitiator. Further, one kind of the photoinitiation auxiliary agent or the sensitizer may be used solely; or two or more kinds may be used in combination.

It is to be noted that because these photoinitiator, photoinitiation auxiliary agent, and sensitizer absorb a specific wavelength, they may in some cases function as ultraviolet absorbents because of decreased sensitivity. Yet, these are not used only for the purpose of improving the sensitivity of the resin composition. Light with a specific wavelength can be absorbed as necessary such that the photoreactivity of the surface can be increased. The line shape and opening of the resist pattern can be changed to a vertical shape, a tapered shape, or a reversed tapered shape. Besides, accuracy of the width of line and a diameter of opening can be improved.

In the present invention, in a case where the curable resin composition is thermosetting, it contains a thermosetting component. Further, even in a case where it is photosensitive, it may contain a thermosetting component in addition to the components described above. By containing the thermosetting component in the curable resin composition, the thermal resistance of the cured coating film can be improved. As the thermosetting component, a known thermosetting component, for example, an amino resin such as a melamine resin, benzoguanamine resin, melamine derivative, or benzoguanamine derivative, an isocyanate compound, a blocked isocyanate compound, a cyclocarbonate compound, an epoxy compound, an oxetane compound, an episulfide resin, bismaleimide, or a carbodiimide resin can be used. A particularly preferred thermosetting component is a thermosetting component having plural cyclic ether groups or cyclic thioether groups (hereinafter, shortened to cyclic (thio)ether groups) in the molecule. One kind of thermosetting component can be used solely; or two or more kinds can be used in combination.

The above thermosetting component having plural cyclic (thio)ether groups in the molecule include a compound having plural groups in the molecule, which groups are 3-, 4-, or 5-membered cyclic (thio)ether groups; and examples of thereof include a compound having plural epoxy groups in the molecule, that is, a polyfunctional epoxy compound;

a compound having plural oxetanyl groups in the molecule, that is, a polyfunctional oxetane compound; and a compound having plural thioether groups in the molecule, that is, an eopisulfide resin.

Examples of such epoxy resins include bisphenol A type epoxy resin, bisphenol F type epoxy resin, hydrogenated bisphenol A type epoxy resin, brominated bisphenol A type epoxy resin, bisphenol S type epoxy resin, phenol novolac type epoxy resin, cresol novolac type epoxy resin, novolac type epoxy resin of bisphenol A, biphenyl type epoxy resin, naphthalene type epoxy resin, dicyclopentadiene type epoxy resin, and triphenylmethane type epoxy resin.

Examples of commercially available epoxy resins include: jER 828, 806, 807, YX8000, YX8034, and 834 manufactured by Mitsubishi Chemical Corporation; YD-128, YDF-170, ZX-1059, and ST-3000 manufactured by NIPPON STEEL Chemical & Material CO., LTD.; EPICLON 830, 835, 840, and 850, N-730A, and N-695 manufactured by DIC Corporation; and RE-306 manufactured by Nippon Kayaku Co., Ltd.

Examples of the polyfunctional oxetane compound include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl)methylacrylate, (3-ethyl-3-oxetanyl)methylacrylate, (3-methyl-3-oxetanyl)methylmethacrylate, (3-ethyl-3-oxetanyl)methylmethacrylate, and an oligomer or an copolymer thereof; and, in addition to those, examples include an etherification product of oxetanealcohol with a resin having a hydroxyl group such as novolak resin, poly(p-hydroxy styrene), cardo-type bisphenols, calixarenes, calixresorcinarenes, or silsesquioxane. Besides, examples include a copolymer of an unsaturated monomer having an oxetane ring and alkyl (meth)acrylate.

Examples of the compound having plural cyclic thioether groups in the molecule include bisphenol A-type episulfide resin. In addition, an episulfide resin obtained by replacing an oxygen atom of the epoxy group of novolak-type epoxy resin with a sulphur atom using the same synthesis method can be used as well.

Examples of the amino resin such as a melamine derivative or a benzoguanamine derivative include a methylol melamine compound, a methylol benzoguanamine compound, a methylol glycoluril compound, and a methylolurea compound.

As the isocyanate compound, a polyisocyanate compound can be combined. Examples of the polyisocyanate compound include: aromatic polyisocyanates such as 4,4'-diphenylmethane diisocyanate, 2,4-tolylene diisocyanate, 2,6-tolylene diisocyanate, naphthalene-1,5-diisocyanate, o-xylylene diisocyanate, m-xylylene diisocyanate, and a 2,4-tolylene dimer; aliphatic polyisocyanates such as tetramethylene diisocyanate, hexamethylene diisocyanate, methylene diisocyanate, trimethyl hexamethylene diisocyanate, 4,4-methylene bis(cyclohexyl isocyanate), and isophorone diisocyanate; aliphatic polyisocyanates such as bicycloheptane triisocyanate; and an adduct product, biuret product, and isocyanurate product of the isocyanate compound listed earlier.

As the blocked isocyanate compound, an addition reaction product of the isocyanate compound and the isocyanate blocking agent can be used. Examples of the isocyanate compound that can react with the isocyanate blocking agent include the above polyisocyanate compound. Examples of the isocyanate blocking agent include: a phenolic blocking agent; a lactam blocking agent; an active methylene-based blocking agent; an alcohol-based blocking agent; an oxime-based blocking agent; a mercaptan-based blocking agent; an acid amide-based blocking agent; an imide-based blocking agent; an amine-based blocking agent; an imidazole-based blocking agent; and an imine-based blocking agent.

In a case where the composition contains an alkali-soluble resin, the amount of the thermosetting component combined is such that the number of functional groups of the thermosetting component that reacts with respect to 1 mol of the carboxyl group contained in the alkali-soluble resin is preferably 0.5 to 2.5 mol and more preferably 0.8 to 2.0 mol in terms of solid content.

Further, a thermosetting catalyst can be added to and combined with the curable resin composition in addition to the above thermosetting component. Examples of the heat-curing catalyst include imidazole, imidazole derivatives such as 2-methylimidazole, 2-ethylimidazole, 2-ethyl-4-methylimidazole, 2-phenylimidazole, 4-phenylimidazole, 1-cyanoethyl-2-phenylimidazole, and 1-(2-cyanoethyl)-2-ethyl-4-methylimidazole; dicyandiamide, amine compounds such as benzyldimethylamine, 4-(dimethylamino)-N,N-dimethylbenzylamine, 4-methoxy-N,N-dimethylbenzylamine, and 4-methyl-N,N-dimethylbenzylamine; hydrazine compounds such as adipic dihydrazide and sebacic dihydrazide; and phosphorus compounds such as triphenylphosphine. In addition, examples of one that is commercially available include: 2MZ-A, 2MZ-OK, 2PHZ, 2P4BHZ, 2P4MHZ (all are trade names of imidazole-based compounds), which are manufactured by Shikoku Chemicals Corporation; and U-CAT 3513N (trade name of a dimethyl amine-based compound), DBU, DBN, and U-CAT SA 102 (all are bicyclic amidine compounds and salts thereof) which are manufactured by San-Apro Ltd. The catalyst is not in particular limited to these; and may be a heat-curing catalyst for an epoxy resin or an oxetane compound, or one that promotes a reaction of at least one kind of an epoxy group and an oxetanyl group with a carboxyl group. The catalyst may be used solely; or two or more kinds may be mixed to be used.

Further, guanamine, acetoguanamine, benzoguanamine, and S-triazine derivatives such as 2,4-diamino-6-methacryloyloxyethyl-S-triazine, 2-vinyl-2,4-diamino-S-triazine, a 2-vinyl-4,6-diamino-S-triazine-isocyanuric acid adduct, and a 2,4-diamino-6-methacryloyloxyethyl-S-triazine-isocyanuric acid adduct can be used. Preferably, these compounds which function also as adhesion imparting agents are used in conjunction with the heat-curing catalyst. One kind of heat-curing catalyst may be solely used, or two or more kinds may be used in combination.

In a case where a thermosetting resin is used as the curable resin, the curable resin composition may further contain a curing agent. Examples of the curing agent include phenol resin, polycarboxylic acids and their acid anhydrides, cyanate ester resin, and active ester resin.

As the above phenol resin, one kind of conventionally known phenol resin as described following can be used solely; or two or more kinds can be used in combination: phenol novolac resin, alkylphenol novolak resin, bisphenol A novolac resin, dicyclopentadiene type phenol resin, Xylok type phenol resin, terpene-modified phenol resin, cresol/naphthol resin, polyvinyl phenols, phenol/naphthol resin, α-naphthol skeleton-containing phenol resin, and triazine-containing cresol novolac resin.

The above polycarboxylic acids and their acid anhydrides are compounds having two or more carboxyl groups in one molecule and their acid anhydrides, and examples thereof include (meta)acrylic acid copolymer, copolymer of maleic anhydride, and dibasic acid condensate as well as a resin having a carboxylic acid terminal such as a carboxylic acid terminal imide resin.

The above cyanate ester resin is a compound having two or more cyanate ester groups (—OCN) in one molecule. As the cyanate ester resin, any conventionally known resin can be used. Examples of the cyanate ester resin include phenol novolac type cyanate ester resin, alkylphenol novolak type cyanate ester resin, dicyclopentadiene type cyanate ester resin, bisphenol A type cyanate ester resin, bisphenol F type cyanate ester resin, and bisphenol S type cyanate ester resin. Further, the cyanate ester resin may be a prepolymer which is partially triazinized.

The above active ester resin is a resin having two or more active ester groups in one molecule. The active ester resin can generally be obtained by a condensation reaction between a carboxylic acid compound and a hydroxy compound. An active ester compound obtained by using a phenol compound or a naphthol compound as the hydroxy compound is particularly preferable. Examples of the phenol compound or naphthol compound include hydroquinone, resorcinol, bisphenol A, bisphenol F, bisphenol S, phenolphthalin, methylated bisphenol A, methylated bisphenol F, methylated bisphenol S, phenol, o-cresol, m-cresol, p-cresol, catechol, α-naphthol, β-naphthol, 1,5-dihydroxynaphthalene, 1,6-dihydroxynaphthalene, 2,6-dihydroxynaphthalene, dihydroxybenzophenone, trihydroxybenzophenone, tetrahydroxybenzophenone, fluoroglucin, benzene triol, dicyclopentadienyl diphenol, and phenol novolac.

Moreover, an alicyclic olefin polymer may be used as the curing agent. Specific examples of a method of producing an alicyclic olefin polymer include: (1) a method of polymerizing an alicyclic olefin having at least one of a carboxyl group and a carboxylic acid anhydride group (hereinafter referred to as "carboxyl group or the like") together with a different monomer, if necessary; (2) a method of hydrogenating an aromatic ring moiety of a (co)polymer obtained by polymerizing an aromatic olefin having a carboxyl group or the like together with a different monomer, if necessary; (3) a method of copolymerizing an alicyclic olefin having no carboxyl group or the like with a monomer having a carboxyl group or the like; (4) a method of hydrogenating an aromatic ring moiety of a copolymer obtained by copolymerizing an aromatic olefin having no carboxyl group or the like and a monomer having a carboxyl group or the like; (5) a method of introducing a compound having a carboxyl group or the like into an alicyclic olefin polymer having no carboxyl group or the like by a degeneration reaction; and (6) a method of converting a carboxylic acid ester group of an alicyclic olefin polymer having a carboxylic acid ester group obtained as described in (1) to (5) above into a carboxyl group by, for example, hydrolysis or the like.

Among the curing agents, phenol resin, active ester resin, and cyanate ester resin are preferable.

The curing agent is preferably combined in a ratio such that the ratio of a functional group capable of a heat-curing reaction to occur such as an epoxy group of a thermosetting resin to a functional group in a curing agent that reacts with the functional group is as follows: the functional group of the curing agent/the functional group capable of a heat-curing reaction to occur (equivalent ratio)=0.2 to 2.0 in terms of solid content. By setting the functional group of the curing agent/the functional group capable of a heat-curing reaction to occur (equivalent ratio) within the above range, it is possible to prevent the surface of the cured film from being roughened in the desmear step. More preferably, the functional group of the curing agent/the functional group capable of a heat-curing reaction to occur (equivalent ratio) is 0.3 to 1.0.

In the present invention, from the viewpoint of improving the physical strength of the cured coating film obtained by using the dry film and adjusting the matte feeling of the surface, the curable resin composition may be combined with a filler as necessary. As the filler, a known inorganic or organic filler can be used; and barium sulfate, spherical silica, hydrotalcite, and talc are particularly preferably used. Further, a metal oxide, a metal hydroxide such as aluminum hydroxide, or the like can be used as an extender pigment filler for the purpose of imparting flame retardance.

The amount of the filler combined is not particularly limited, but is preferably 25% to 80% by mass based on the total amount of the composition in terms of solid content from the viewpoint of viscosity, coating property, formability, and the like.

Further, the above filler may be surface-treated in order to enhance the dispersibility in the curable resin composition. Aggregation can be suppressed by using a surface-treated filler. The surface treatment method is not particularly limited, and a commonly-used known method may be used. However, it is preferable to treat the surface of the inorganic filler with a surface treatment agent having a curable reactive group, for example, a coupling agent having a curable reactive group as an organic group.

As the coupling agent, coupling agents such as silane-based, titanate-based, aluminate-based, and zircoaluminate-based coupling agents can be used. Of these, a silane-based coupling agent is preferable. Examples of such a silane-based coupling agent can include vinyl trimethoxysilane, vinyl triethoxysilane, N-(2-aminomethyl)-3-aminopropylmethyl dimethoxysilane, N-(2-aminoethyl)-3-aminopropyl trimethoxysilane, 3-aminopropyl triethoxysilane, 3-anilinopropyl trimethoxysilane, 3-glycydoxypropyl trimethoxysilane, 3-glycydoxypropylmethyl dimethoxysilane, 2-(3,4-epoxycyclohexyl) ethyl trimethoxysilane, 3-methacryloxypropyl trimethoxysilane, and 3-mercaptopropyl trimethoxysilane. These can be used solely or in combination. It is preferable that these silane-based coupling agents are previously immobilized on the surface of the filler by adsorption or reaction. Here, the amount treated by the coupling agent with respect to 100 parts by mass of spherical silica is preferably 0.5 to 10 parts by mass.

The curable resin composition may contain a colorant as necessary. As the colorant, a known colorant such as red, blue, green, or yellow can be used; and it may be any of pigment, dye, and coloring matter. However, it is preferably a colorant that does not contain halogens from the viewpoint of reduction of environmental load and effects on the human body.

As the red color colorant, monoazo-based, disazo-based, azo lake-based, benzimidazolone-based, perylene-based, diketopyrrolopyrrole-based, condensed azo-based, anthraquinone-based, quinacridone-based red color colorant, and the like are available; and specific examples thereof include those given Colour Index International (C.I.; published by The Society of Dyers and Colourists) numbers as shown below.

Examples of the monoazo-based red color colorant include Pigment Red 1, 2, 3, 4, 5, 6, 8, 9, 12, 14, 15, 16, 17, 21, 22, 23, 31, 32, 112, 114, 146, 147, 151, 170, 184, 187, 188, 193, 210, 245, 253, 258, 266, 267, 268, and 269. Further, examples of the disazo-based red color colorant include Pigment Red 37, 38, and 41. Further, examples of the monoazo lake-based red color colorant include Pigment Red 48:1, 48:2, 48:3, 48:4, 49:1, 49:2, 50:1, 52:1, 52:2, 53:1, 53:2, 57:1, 58:4, 63:1, 63:2, 64:1, and 68. Further, examples of the benzimidazolone-based red color colorant include Pigment Red 171, 175, 176, 185, and 208. Further, examples of the perylene-based red color colorant include Solvent Red 135, 179, Pigment Red 123, 149, 166, 178, 179, 190, 194, and 224. Further, examples of the diketopyrrolopyrrole-based red color colorant include Pigment Red 254, 255, 264, 270, and 272. Further, examples of the condensed azo-based red color colorant include Pigment Red 220, 144, 166, 214, 220, 221, and 242. Further, examples of the anthraquinone-based red color colorant include Pigment Red 168, 177, and 216, Solvent Red 149, 150, 52, and 207. Further, examples of the quinacridone-based red color colorant include Pigment Red 122, 202, 206, 207, and 209.

As the blue color colorant, phthalocyanine-based and anthraquinone-based colorants are available. Examples of the pigment-based colorant include compounds classified as Pigment, for example, Pigment Blue 15, 15:1, 15:2, 15:3, 15:4, 15:6, 16, and 60. As the dye-based blue color colorant, Solvent Blue 35, 63, 68, 70, 83, 87, 94, 97, 122, 136, 67, 70, and the like can be used. Besides, metal-substituted or unsubstituted phthalocyanine compounds can be sued as well.

As the yellow color colorant, monoazo-based, disazo-based, condensed azo-based, benzimidazolone-based, isoindolinone-based, anthraquinone-based yellow color colorants, and the like are available; and examples of the anthraquinone-based yellow color colorant include Solvent Yellow 163, Pigment Yellow 24, 108, 193, 147, 199, and 202. Examples of the isoindolinone-based yellow color colorant include Pigment Yellow 110, 109, 139, 179, and 185. Examples of the condensed azo-based yellow color colorant include Pigment Yellow 93, 94, 95, 128, 155, 166, and 180. Examples of the benzimidazolone-based yellow color colorant include Pigment Yellow 120, 151, 154, 156, 175, and 181. Further, examples of the monoazo-based yellow color colorant include Pigment Yellow 1, 2, 3, 4, 5, 6, 9, 10, 12, 61, 62, 62:1, 65, 73, 74, 75, 97, 100, 104, 105, 111, 116, 167, 168, 169, 182, and 183. Further, examples of the disazo-based yellow color colorant include Pigment Yellow 12, 13, 14, 16, 17, 55, 63, 81, 83, 87, 126, 127, 152, 170, 172, 174, 176, 188, and 198.

Besides, a colorant such as violet, orange, brown, black, or white may be added. Specific examples thereof include Pigment Black 1, 6, 7, 8, 9, 10, 11, 12, 13, 18, 20, 25, 26, 28, 29, 30, 31, and 32; Pigment Violet 19, 23, 29, 32, 36, 38, and 42; Solvent Violet 13 and 36; C.I. Pigment Orange 1, 5, 13, 14, 16, 17, 24, 34, 36, 38, 40, 43, 46, 49, 51, 61, 63, 64, 71, and 73; Pigment Brown 23 and 25; carbon black; and titanium oxide.

The amount of the colorant combined in the curable resin composition is not particularly limited, but it is preferably 0.1% to 5% by mass of the total amount of the resin composition.

The curable resin composition may contain an organic solvent from the viewpoint of the ease of preparation and coating property when forming the curable resin layer. As the organic solvent, commonly-used known organic solvents can be used, which include: ketones such as methyl ethyl ketone and cyclohexanone; aromatic hydrocarbons such as toluene, xylene, and tetramethylbenzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, diethylene glycol monomethyl ether acetate, and tripropylene glycol monomethyl ether; esters such as ethyl acetate, butyl acetate, butyl lactate, cellosolve acetate, butyl cellosolve acetate, carbitol acetate, butyl carbitol acetate, propylene glycol monomethyl ether acetate, dipropylene glycol monomethyl ether acetate, and propylene carbonate; aliphatic hydrocarbons such as octane and decane; and petroleum solvents such as petroleum ether, petroleum naphtha, and solvent naphtha. One kind of organic solvent can be used solely; or two or more kinds can be used in combination.

The amount of the organic solvent combined in the curable resin composition can be changed as appropriate depending on the material constituting the curable resin composition. In a case where the organic solvent is combined, the amount may be, for example, 5% to 90% by mass based on the total amount of the composition.

In addition, the curable resin composition may further be combined as necessary with an elastomer, a mercapto compound, an urethanization catalyst, a thixotropic agent, an adhesion promoter, a block copolymer, a chain transfer agent, a polymerization inhibitor, a copper damage inhibitor, an antioxidant, an anti-rust agent, a thickener such as organic bentonite or montmorillonite, at least one kind of antifoaming agents and leveling agents based on silicone, fluorine, polymer, and the like, and a flame retardant of a phosphorus compound such as hypophosphorous acid, a phosphate ester derivative, or a phosphazene compound. As for these, products known in the field of electronic materials can be used.

For the curable resin layer, the above curable resin composition can be diluted with an organic solvent to adjust to an appropriate viscosity; applied on the surface of the supporting film using a comma coater, a blade coater, an LIP coater, a rod coater, a squeeze coater, a reverse coater, a transfer roll coater, a gravure coater, a spray coater, or the like such that a uniform thickness is attained on the carrier film; and dried usually at a temperature of 50° C. to 130° C. for 1 to 30 minutes, thereby obtaining a coating film. The thickness of the coating film is not in particular restricted; and is in general selected as appropriate in a range of 1 to 150 µm and preferably 10 to 60 µm in the thickness after the drying.

[Protective Film]

For the purpose of preventing dust and the like from adhere to the surface of the above curable resin layer and concurrently improving the operatability or the like, the protective film 30 may further be provided on the side of the dry film opposed to the side that is in contact with the supporting film 10 of the curable resin layer 20 as shown in FIG. 2.

As the protective film, a polyester film, a polyethylene film, a polytetrafluoroethylene film, a polypropylene film, paper subjected to a surface treatment, and the like can for example be used. A material is preferably selected such that adhesion between the protective film and the curable resin layer is smaller than adhesion between the supporting film and the curable resin layer. In addition, at the time of using the dry film, the surface that contact with the curable resin layer of the protective film may be subjected to the anti-sticking treatment described above for the purpose of making the detachment of the protective film easier.

The thickness of the protective film is not in particular restricted and is selected as appropriate in a range of approximately 10 to 150 µm according to the application.

[Method of Forming Cured Coating Film Using Dry Film]

A cured coating film can be formed using the above dry film. A method of forming a cured coating film and a method of producing a printed wiring board which includes the above cured product (cured coating film) on a board on which a circuit pattern is formed will be described below. As an example of use in a case where the dry film is photosensitive, a method of producing a printed wiring board using the dry film that includes a protective film will be described.

i) First, the protective film is detached from the dry film to expose the curable resin layer.
ii) Then, the curable resin layer of the dry film is laminated on the board on which a circuit pattern is formed.
iii) Exposure is carried out from above the supporting film of the dry film.
iv) The supporting film is detached from the dry film and development is carried out, thereby forming the curable resin layer that is patterned on the board.
v) The curable resin layer patterned is cured by light irradiation or heating to form a cured coating film.

Thus, a printed wiring board is formed. It is to be noted that in a case where the dry film that does not have a protective film is used, it goes without saying that the step of detaching the protective film (step i) is not needed. Each of the steps will be described below.

First, the protective film is detached from the dry film to expose the curable resin layer; and the curable resin layer of the dry film is laminated on the board on which a circuit pattern is formed. Examples of the board on which a circuit pattern is formed can include, in addition to printed wiring boards on which a circuit is in advance formed and flexible printed wiring boards, all grades (FR-4 and the like) of copper clad laminates that use materials of copper clad laminates for high frequency circuit using paper phenol, paper epoxy, glass cloth epoxy, glass polyimide, glass cloth/non-woven fabric epoxy, glass cloth/paper epoxy, synthetic fiber epoxy, fluorine resin-polyethylene-polyphenylene ether, polyphenylene oxide-cyanate ester, or the like, other polyimide films, PET films, glass boards, ceramic boards, and wafer boards.

To laminate the curable resin layer of the dry film on the circuit board, lamination is preferably carried out using a vacuum laminator or the like under applied pressure and heating. By using such a vacuum laminator, no air bubbles are mixed and improved filling up dents of the board surface is seen because the curable resin layer is closely attached to the circuit board. The applied pressure condition is preferably about 0.1 to 2.0 MPa; and the heating condition is preferably 40° C. to 120° C.

Next, exposure (irradiation of an active energy ray) is carried out from above the supporting film of the dry film. By this step, the exposed curable resin layer is exclusively cured. The exposure step is not in particular restricted. The exposure may selectively be carried out by, for example, a contact method (or a noncontact method), through the photomask in which a desired pattern is formed using an active energy ray; or a desired pattern may be formed by exposure using a direct patterning apparatus by an active energy ray.

An exposure apparatus used for the active energy ray irradiation only need to be an apparatus that includes a high-pressure mercury vapor lamp, an ultrahigh pressure mercury vapor lamp, a metal halide lamp, or the like, and radiates an ultraviolet ray of 350 to 450 nm. Further, a direct patterning apparatus (for example, a laser direct imaging apparatus that directly draws picture images using a laser based on CAD data from a computer) can also be used. A source of laser light of the direct patterning equipment may be either a gas laser or a solid laser as long as it employs a laser light with a maximum wavelength in a range of 350 to 410 nm. The exposure amount for the picture image formation varies in film thickness and the like, and can in general be set to a range of 20 to 800 mJ/cm$^2$ and preferably 20 to 600 mJ/cm$^2$. Further, the exposure light may be scattered light or parallel light, but it is preferably scattered light.

After exposure, the supporting film is detached from the curable resin layer and development is carried out, thereby forming the curable resin layer that is patterned on the board. In the curable resin layer at the non-patterned portion, the surface of the curable resin layer is formed to have roughness morphology by exposure through the supporting film. As long as the characteristics are not impaired, exposure may be performed after the supporting film is detached from the curable resin layer after being laminated on the circuit board.

A photomask described in the method of forming a cured coating film using a curable resin composition described later may be used. In such a case, it is preferable to use a supporting film that does not have the above pattern, and the supporting film may be exposed and developed after detaching the supporting film from the dry film before exposure to the extent that the characteristics are not impaired.

The development step is not in particular restricted; and a dipping method, a shower method, a spray method, a brush method, or the like can be employed. Further, as a development liquid, an aqueous solution of alkali such as potassium hydroxide, sodium hydroxide, sodium carbonate, potassium carbonate, sodium phosphate, sodium silicate, ammonia, or amines can be used.

Subsequently, the curable resin layer patterned is cured by active energy ray (light) irradiation or heating to form a cured coating film. This step is called final curing or additional curing, promotes the polymerization of unreacted monomers in the exposed curable resin layer, and further can proceed thermal curing of carboxyl group-containing photosensitive resin and the epoxy resin to reduce the amount of remaining carboxyl group. The active energy ray irradiation can be carried out in the same manner as described in the above exposure; and preferably carried out in a stronger condition than the irradiation energy at the time of the exposure. For example, the irradiation energy can be set to 500 to 3000 mJ/cm$^2$. In addition, the thermal curing can be carried out in a heating condition of about 100° C. to 200° C. for 20 to 90 minutes. It is to be noted that the final curing is preferably is carried out after the photo-curing. By carrying out the photo-curing before the thermal curing, the flow of the resin may be inhibited even at the time of the thermal curing and the incorporated surface may be maintained.

The above method of forming a cured coating film uses a dry film formed from a photocurable and thermosetting resin composition as the curable resin composition. A method of forming a cured coating film using a photocurable resin composition or a thermosetting resin composition will also be described below.

In a case where a cured coating film is formed only by photo-curing, for example, after applying a curable resin composition to a substrate by pattern printing or the like, a cured coating film may be formed by irradiation with active energy rays (for example, 1,000 to 2,000 mJ/cm$^2$) to cure the curable resin composition.

In a case where a cured coating film is formed only by heat-curing, for example, after applying a curable resin composition to a substrate by pattern printing or the like, a cured coating film may be formed by heating (for example, at a temperature of 100° C. to 22° C. for 30 to 90 minutes) to cure the curable resin composition.

In order to allow a cured coating film formed only by photo-curing or heat-curing to have a surface morphology with an uneven portion and a certain flat portion, for example, a supporting film obtained by exposing and developing the coating surface with a negative film having a dot array-like pattern on the surface may be laminated on a curable resin layer such that the shape of the surface of the supporting film is incorporated into the curable resin layer as described above. After that, it is as described in i), ii), and v) of the formation method using the dry film described above. The supporting film is detached either before or after curing, but is detached preferably after curing. In addition to the above methods, it is possible to incorporate a prescribed surface morphology to the surface of the dry coating film of the curable resin composition using a transfer roller or the like or to use a dry film obtained by applying a curable resin composition to a supporting film having a surface that has been processed into a specific shape in advance and drying it; however, the formation method is not limited thereto.

[Method of Forming Cured Coating Film Using Curable Resin Composition]

The above curable resin composition is adjusted to a viscosity suitable for the coating method using an organic solvent, and applied onto a substrate by a dip coating method, flow coating method, roll coating method, bar coater method, screen printing method, curtain coating method, or the like, and then the organic solvent contained in the composition is volatilized and dried (transiently dried) at a temperature of 60° C. to 100° C., thereby obtaining a tack-free resin layer. The organic solvent can be volatilized and dried using a hot air circulation drying furnace, an IR furnace, a hot plate, a convection oven, or the like (a method comprising countercurrent-contacting of a heated air in a dryer using one that includes a heat source in the mode of heating air by steam, and a method comprising spraying a support from a nozzle).

After a dry coating film of the curable resin composition is formed on the substrate, it is selectively exposed to active energy rays through a photomask having a prescribed pattern, and the unexposed portion is developed to form a pattern of a cured product.

Further, in the present invention, at least one of heating and ultraviolet irradiation may be performed on the developed resin layer after the above exposure and development and before irradiation with active energy rays described later. For example, the resin layer formed by exposure and development is heat-cured (100° C. to 220° C.) or re-exposed after heat-curing, or the final finish-curing (final curing) is performed only by heat-curing, thereby forming a cured coating film with excellent properties such as adhesion and hardness. According to the method of the present invention, even such a cured coating film having increased adhesion to the substrate can be easily removed by a solvent.

Each condition after exposure is the same as the method of forming a cured coating film using a dry film. However, as the photomask, it is preferable to use a photomask having the same pattern as the supporting film in the method of forming a cured coating film using a dry film. In other words, it is preferable that at least one side of the photomask (negative film) is provided with a pattern having a light-shielding portion and a light-transmitting portion through which light passes between adjacent light-shielding portions. The light-shielding portion is provided in a dot-array shape such that light incident from one side of the photomask (exposure light) is diffracted when emitted from the other side to generate interference fringes. In order to form a light-shielding portion of the photomask (negative film), a light-shielding portion can be formed on the surface of a light-transmitting photomask by using vapor deposition etching, a gravure offset method, photo-patterning, or the like. The method using a photomask (negative film) having a prescribed light-shielding portion formed on the surface as described above is particularly effective in a case where the curable resin composition is photosensitive. In the present invention, the area ratio of the light-shielding portion to the entire photomask is preferably 10% to 90%, more preferably 25% to 75%, and particularly preferably 35% to 60%.

Examples of the substrate can include, in addition to printed wiring boards on which a circuit is in advance formed with copper or the like and flexible printed wiring boards, all grades (FR-4 and the like) of copper clad laminates that use materials of copper clad laminates for high frequency circuit using paper phenol, paper epoxy, glass cloth epoxy, glass polyimide, glass cloth/non-woven fabric epoxy, glass cloth/paper epoxy, synthetic fiber epoxy, fluorine resin-polyethylene-polyphenylene ether, polyphenylene oxide-cyanate, or the like, other wafer boards, metal boards, polyimide films, polyethylene terephthalate films, polyethylene naphthalate (PEN) films, glass boards, ceramic boards, and wafer substrates. Of these, copper clad laminates are particularly preferable.

The thickness of the cured coating film according to the present invention may be set as appropriate depending on the intended use of the wiring board, and whether it is a curable resin composition or a curable resin layer of a dry film, the thickness after curing is preferably in a range of 1 to 1,000 μm.

The cured coating film according to the present invention is useful as a permanent coating film for a printed wiring board such as a solder resist, a coverlay, and an interlayer insulating layer, and is particularly useful as a cured coating film for a solder resist. In particular, it can be suitably used for applications that require a matte-like cured coating film. Further, it can be used not only for applications that require a patterned cured coating film, but also for applications that do not require patterning, such as molding applications (sealing applications).

EXAMPLES

By way of Examples, the present invention will be described in detail below. However, the present invention is by no means limited to these Examples.

Example 1

[Preparation of Supporting Film]

A supporting film was prepared by forming a circular dot-array pattern (light-shielding portion) as shown in FIG. 8 on one side of a transparent polyester film with a thickness of 25 μm (Lumirror #25-T60 manufactured by Toray Industries, Inc.). In the circular pattern printed on the surface of the supporting film, the distance between the adjacent circular patterns (light-shielding portion) was 10 μm, the area ratio of the light-shielding portion to the entire supporting film was about 39%, the area ratio of all circular patterns (light-shielding portion) to the entire support film was also about 39%, and the size of each circular pattern (light-shielding portion) was set to 10 μm.

[Preparation of Dry Film]

(Synthesis of Resin Varnish 1 of Alkali-Soluble Resin)

To an autoclave that included a thermometer, a nitrogen introduction apparatus and alkylene oxide introduction apparatus, and a stirring apparatus, 119.4 g of novolak-type cresol resin (trade name: "Shonol CRG951" manufactured by Aica Kogyo Co., Ltd., OH equivalent: 119.4), 1.19 g of potassium hydroxide, and 119.4 g of toluene were charged. The system was subjected, while stirred, to internal nitrogen replacement and heated to increase the temperature. Subsequently, 63.8 g of propylene oxide was gradually added dropwise; and the resulting mixture was allowed to proceed a reaction at 125° C. to 132° C. and 0 to 4.8 kg/cm² for 16 hours. Thereafter, the resultant was cooled to room temperature; and this reaction solution was added and mixed with 1.56 g of 89% phosphoric acid to neutralize potassium hydroxide, thereby obtaining a propylene oxide reaction solution of novolak-type cresol resin with a solid content of 62.1% and a hydroxyl value of 182.2 g/eq. In the obtained product, an average of 1.08 mol of alkylene oxide was added per equivalent of phenolic hydroxyl group. Next, to a reactor that include a stirring apparatus, a thermometer, and an air blowing tube, 293.0 g of the obtained alkylene oxide reaction solution of novolak-type cresol resin, 43.2 g of acrylic acid, 11.53 g of methanesulfonic acid, 0.18 g of methylhydroquinone, and 252.9 g of toluene were charged. Air was blown therein at a rate of 10 ml/min. The resulting mixture was allowed to proceed a reaction at 110° C. for 12 hours while stirred. As for water generated by the reaction, 12.6 g of water was distilled as an azeotropic mixture with toluene. Thereafter, the resultant was cooled to room temperature; and the obtained reaction solution was neutralized with 35.35 g of a 15% aqueous sodium hydroxide solution and then washed with water. Thereafter, toluene was replaced with 118.1 g of diethylene glycol monoethyl ether acetate and distilled away in an evaporator, thereby obtaining a novolak-type acrylate resin solution. Subsequently, to a reactor that include a stirring apparatus, a thermometer, and an air blowing tube, 332.5 g of the obtained novolak-type acrylate resin solution, and 1.22 g of triphenylphosphine. Air was blown therein at a rate of 10 ml/min; and 60.8 g of tetrahydrophthalic anhydride was, while stirred, gradually added thereto. The resultant was allowed to proceed a reaction at 95° C. to 101° C. for six hours while stirred. Accordingly, a resin varnish 1 of alkali-soluble resin having a solid acid value of 88 mgKOH/g, a solid content of 71%, and a weight average molecular weight of 2,000 was obtained.

(Synthesis of Resin Varnish 2 of Alkali-Soluble Resin)

A four-necked flask equipped with a stirring apparatus and a reflux condenser was charged with 220 g of a cresol novolak type epoxy resin (EPICLON N-695 manufactured by DIC Corporation, epoxy equivalent: 220), 214 g of carbitol acetate was added, and the mixture was heated and dissolved. Next, 0.1 g of hydroquinone as a polymerization inhibitor and 2.0 g of dimethylbenzylamine as a reaction catalyst were added. The mixture was heated to 95° C. to 105° C., 72 g of acrylic acid was gradually added dropwise, and the mixture was reacted for 16 hours. The reaction product was cooled to 80° C. to 90° C., 106 g of tetrahydrophthalic anhydride was added, the mixture was reacted for 8 hours and cooled, and then the resultant was collected. The resin varnish 2 of alkali-soluble resin thus obtained had a solid content of 65%, a solid acid value of 100 mgKOH/g, and a weight average molecular weight (Mw) of about 3,500.

Fifty (50) parts by mass of the alkali-soluble resin varnish 1 or 50 parts by mass of the alkali-soluble resin varnish 2 obtained as described above (each in terms of solid content), 30 parts by mass of dipentaerythritol hexaacrylate (DPHA manufactured by Nippon Kayaku Co., Ltd.) as a photosensitive monomer, 10 parts by mass of 2-[4-(methylthio) benzoyl]-2-(4-morpholinyl)propane (Omnirad 907 manufactured by IGM Resins B.V.) as a photoinitiator, 0.5 parts by mass of ethanone, 1-[9-ethyl-6-(2-methylbenzoyl)-9H-carbazole-3-yl]-,1-(0-acetyloxime) (Irgacure OXE02 manufactured by BASF Japan Ltd.), 0.5 parts by mass of 2,4-diethylthioxanthone (KAYACURE DETX-S manufactured by Nippon Kayaku Co., Ltd.) as a sensitizer, 20 parts by mass of bisphenol A type epoxy resin (EPICLON 840-S manufactured by DIC Corporation) as a thermosetting component, 10 parts by mass of 1,3,5-tris(2,3-epoxypropyl)-1, 3,5-triazine-2,4,6(1H, 3H, 5H)-trion (high melting point type, TEPIC-HP manufactured by Nissan Chemical Corporation), 90 parts by mass of barium sulfate (average particle diameter: 5 to 8 μm, refractive index: 1.64) as a filler, and 0.8 parts by mass of blue colorant (C.I. Pigment Blue 15: 3), 0.3 parts by mass of yellow colorant (C.I. Pigment Yellow 147), and 1.2 parts by mass of red colorant (Paliogen Red K3580 manufactured by BASF Japan Ltd.) as colorants were combined and mixed in advance using a stirring apparatus, and then kneaded using a three-roll mill, thereby preparing a curable resin composition.

To the curable resin composition obtained as described above, 300 g of methyl ethyl ketone was added to dilute, and the resultant was stirred for 15 minutes using a stirring apparatus, thereby obtaining a coating liquid. The coating liquid was applied to the side opposite to the printed side of the supporting film and usually dried at a temperature of 90° C. for 15 minutes to form a curable resin layer with a thickness of 20 μm. A polypropylene film (OPP-FOA manufactured by Futamura Chemical Co., Ltd.) with a thickness of 18 μm was then laminated on the curable resin layer to prepare a dry film.

[Preparation of Cured Coating Film]

The surface of the copper clad laminate board (95 mm×150 mm×1.6 mmt) was subjected to chemical polishing. The polypropylene film was detached from the dry film obtained as described above; and the curable resin layer of the dry film was laminated on the surface of the side of the board subjected to the surface polishing. Subsequently, thermal laminating was carried out using a vacuum laminator (MVLP-500 manufactured by Meiki Co., Ltd.) in conditions of a degree of applied pressure: 0.8 Mpa, 70° C., one minute, a degree of vacuum: 133.3 Pa to closely adhere the board with the curable resin layer.

Subsequently, exposure was carried out on the curable resin layer from the supporting film side of the dry film using an exposure apparatus equipped with a high-pressure mercury vapor lamp (short arc lamp) such that the sensitivity was set to Step Number 7 with a step tablet (Kodak No. 2). Thereafter, the supporting film was detached from the dry film to expose the curable resin layer. Thereafter, development was carried out for 120 seconds in conditions of 30° C. and a spray pressure of 2 kg/cm² using a 1% by weight Na₂CO₃ aqueous solution to form a resin layer. Subsequently, irradiation to the resin layer was carried out at a light exposure of 1 J/cm² in a UV conveyor furnace that included a high-pressure mercury vapor lamp. Thereafter, the resin layer was completely cured by heating at 150° C. for 60 minutes to form a cured coating film. When curing was completed, a waste cloth containing isopropyl alcohol (IPA) was placed on the surface of the above curable resin layer cooled to room temperature in an environment of 25° C. and 50% RH. Further, a weight of 500 g was placed thereon and allowed to stand for one minute, following which the waste cloth was removed. It was confirmed that all or part of the curable resin layer was not adhering to the surface of the waste cloth which was in contact with the cured coating film. When the surface of the obtained cured coating film was visually confirmed, it had a good matte feeling.

Figure 9:
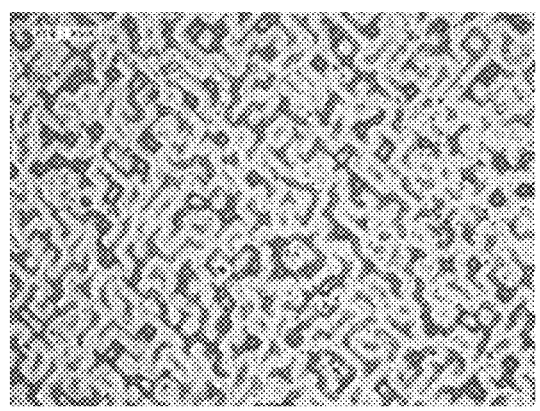
FIG. 9 is an optical micrograph (500 magnifications) of the surface of the cured coating obtained using the dry film of Example 1.

An electron microscopic observation photograph (500 magnifications) of the surface of the cured coating film obtained as described above is shown in FIG. 9. It is understood that the cured coating film obtained by the dry film using the supporting film as described above has a complicated surface morphology including a flat portion and an uneven portion.

Example 2

[Preparation of Curable Resin Compositions]

The curable resin composition used for the dry film of Example 1 was used without forming a dry film.

[Preparation of Cured Coating Film]

The surface of the copper clad laminate board (95 mm×150 mm×1.6 mmt) was subjected to chemical polishing with CZ8101. The curable resin composition was screen-printed (150 mesh, TETORON) such that the film thickness after drying was 15 μm on the surface of the side of the board subjected to the chemical polishing. Subsequently, drying was carried out in a hot air circulation drying furnace at 80° C. for 30 minutes to form a curable resin layer.

Subsequently, exposure was carried out on the curable resin layer via a photomask using an exposure apparatus equipped with a high-pressure mercury vapor lamp (short arc lamp) such that the sensitivity was set to Step Number 7 with a step tablet (Kodak No. 2). Thereafter, development was carried out for 120 seconds in conditions of 30° C. and a spray pressure of 2 kg/cm$^2$ using a 1% by weight $Na_2CO_3$ aqueous solution to form a resin layer. Here, the photomask described later was used as the photomask. Subsequently, irradiation to the resin layer was carried out at a light exposure of 1 J/cm$^2$ in a UV conveyor furnace that included a high-pressure mercury vapor lamp. Thereafter, the resin layer was completely cured by heating at 150° C. for 60 minutes to form a cured coating film. When curing was completed, a waste cloth containing isopropyl alcohol (IPA) was placed on the surface of the above curable resin layer cooled to room temperature in an environment of 25° C. and 50% RH. Further, a weight of 500 g was placed thereon and allowed to stand for one minute, following which the waste cloth was removed. It was confirmed that all or part of the curable resin layer was not adhering to the surface of the waste cloth which was in contact with the cured coating film. When the surface of the obtained cured coating film was visually confirmed, it had a good matte feeling.

[Preparation of Photomask]

A photomask was prepared by forming a circular dot-array pattern (light-shielding portion) on the surface of a transparent polyester film with a thickness of 175 μm as with the support film of Example 1. The distance between the adjacent circular patterns (light-shielding portion) was 10 μm, the area ratio of the light-shielding portion to the entire photomask was about 39%, the area ratio of all circular patterns (light-shielding portion) to the entire film was also about 39%, and the size of each circular pattern (light-shielding portion) was set to 10 μm. The photomask was arranged such that the surface with the circular pattern was on the dry film side, and the distance between the photomask and the dry film was set to 200 μm.

Example 3

[Preparation of Supporting Film]

One hundred (100) parts by mass (in terms of solid content) of an alkali-soluble copolymer resin (Cyclomer P (ACA) 250 manufactured by DAICEL-ALLNEX Ltd.) as an alkali-soluble resin, 10 parts by mass of trimethylolpropane trimethacrylate as a photosensitive monomer, 60 parts by mass of EO-modified bisphenol A dimethacrylate (FA-321M manufactured by Hitachi Chemical Company, Ltd.), and 10 parts by mass of 2,4,6-trimethylbenzoyl diphenylphosphine oxide (Omnirad TPO H manufactured by IGM Resins B.V.) as a photoinitiator were combined and mixed in advance using a stirring apparatus, and then kneaded using a three-roll mill, thereby preparing a curable resin composition.

To the curable resin composition obtained as described above, 300 g of methyl ethyl ketone was added to dilute, and the resultant was stirred for 15 minutes using a stirring apparatus, thereby obtaining a coating liquid. The coating liquid was applied to one side of a polyethylene terephthalate film (E5041 manufactured by TOYOBO Co., Ltd.) with a thickness of 25 μm and dried at a temperature of 90° C. for 15 minutes to form a curable resin layer.

Subsequently, exposure was carried out on the curable resin layer via a photomask using an exposure apparatus equipped with a high-pressure mercury vapor lamp (short arc lamp) such that the sensitivity was set to Step Number 7 with a step tablet (Kodak No. 2). Thereafter, development was carried out for 60 seconds in conditions of 30° C. and a spray pressure of 2 kg/cm$^2$ using a 1% by weight $Na_2CO_3$ aqueous solution. Here, the photomask was prepared by forming a circular dot-array pattern (light-shielding portion) as shown in FIG. 8 on one side of a photomask with a thickness of 25 μm. On the circular pattern printed on the photomask surface, the distance between the adjacent circular patterns (light-shielding portion) was 10 μm, the area ratio of the light-shielding portion to the entire photomask was about 39%, the area ratio of all circular patterns (light-shielding portion) to the entire photomask was also about 39%, and the size of each circular pattern (light-shielding portion) was set to 10 μm.

[Preparation of Dry Film]

Forty (40) parts by mass of bisphenol A type liquid epoxy resin (EPICLON840-S manufactured by DIC Corporation) as an epoxy resin, 20 parts by mass of bisphenol type semi-solid epoxy resin (EPICLON860 manufactured by DIC Corporation), 40 parts by mass of naphthalene skeleton-modified polyfunctional epoxy resin (EPICLON HP-5000 manufactured by DIC Corporation), 10 parts by mass of phenol novolac resin (HF-1M manufactured by Meiwa Plastic Industries, Ltd.) as a curing agent, 80 parts by mass of a resin having an active ester group (EPICLPONHPC-8000, manufactured by DIC Corporation), 300 parts by mass of spherical silica (SO-01 manufactured by Admatechs Company Limited, average particle diameter: 200 nm) as an inorganic filler, 0.5 parts by mass of dimethylaminopyridine as a curing accelerator, and 50 parts by mass of diethylene glycol monoethyl ether acetate as an organic solvent were combined and mixed in advance using a stirring apparatus, and then kneaded using a three-roll mill, thereby preparing a curable resin composition.

To the curable resin composition obtained as described above, 300 g of methyl ethyl ketone was added to dilute, and the resultant was stirred for 15 minutes using a stirring apparatus, thereby obtaining a coating liquid. The coating liquid was applied to the exposed and developed side of the above supporting film and usually dried at a temperature of 90° C. for 15 minutes to form a curable resin layer with a thickness of 20 μm. A polypropylene film (OPP-FOA manufactured by Futamura Chemical Co., Ltd.) with a thickness of 18 μm was then laminated on the curable resin layer to prepare a dry film.

[Preparation of Cured Coating Film]

The surface of the copper clad laminate board (95 mm×150 mm×1.6 mmt) was subjected to chemical polishing. The polypropylene film was detached from the dry film obtained as described above; and the curable resin layer of the dry film was laminated on the surface of the side of the board subjected to the surface polishing. Subsequently, thermal laminating was carried out using a vacuum laminator (MVLP-500 manufactured by Meiki Co., Ltd.) in conditions of a degree of applied pressure: 0.8 Mpa, 70° C., one minute, a degree of vacuum: 133.3 Pa to closely adhere the board with the curable resin layer.

Next, the resin layer was completely cured by heating at 150° C. for 60 minutes to form a cured coating film. After curing, the supporting film was detached. When curing was completed, a waste cloth containing isopropyl alcohol (IPA) was placed on the surface of the above curable resin layer cooled to room temperature in an environment of 25° C. and 50% RH. Further, a weight of 500 g was placed thereon and allowed to stand for one minute, following which the waste cloth was removed. It was confirmed that all or part of the curable resin layer was not adhering to the surface of the waste cloth which was in contact with the cured coating film. When the surface of the obtained cured coating film was visually confirmed, it had a good matte feeling. Further, tests 1 and 2 described later were performed within 5 minutes after the supporting film was detached.

Comparative Example 1

A cured coating film was formed in the same manner as in Example 1 except that a transparent polyester film having a thickness of 25 μm (Lumirror #25-T60 manufactured by Toray Industries, Inc.,) having no circular pattern was used as the supporting film. When the surface of the obtained cured coating film was visually confirmed, it had a glossy feeling and did not have a good matte feeling.

Comparative Example 2

[Preparation of Curable Resin Compositions]

Fifty (50) parts by mass of the alkali-soluble resin varnish 1 or 50 parts by mass of the alkali-soluble resin varnish 2 (each in terms of solid content), 30 parts by mass of dipentaerythritol hexaacrylate (DPHA manufactured by Nippon Kayaku Co., Ltd.) as a photosensitive monomer, 10 parts by mass of 2-[4-(methylthio)benzoyl]-2-(4-morpholinyl)propane (Omnirad 907 manufactured by IGM Resins B.V.) as a photoinitiator, 0.5 parts by mass of ethanone, 1-[9-ethyl-6-(2-methylbenzoyl)-9H-carbazole-3-yl]-,1-(0-acetyloxime) (Irgacure OXE02 manufactured by BASF Japan Ltd.), 0.5 parts by mass of 2,4-diethylthioxanthone (KAYACURE DETX-S manufactured by Nippon Kayaku Co., Ltd.) as a sensitizer, 20 parts by mass of bisphenol A type epoxy resin (EPICLON 840-S manufactured by DIC Corporation) as a thermosetting component, 10 parts by mass of 1,3,5-tris(2,3-epoxypropyl)-1,3,5-triazine-2,4,6(1H, 3H, 5H)-trion (high melting point type, TEPIC-HP manufactured by Nissan Chemical Corporation), 90 parts by mass of barium sulfate (average particle diameter: 5 to 8 μm, refractive index: 1.64) as a filler, 250 parts by mass of Burgess Clay #60 (manufactured by Shiraishi Calcium Kaisha, Ltd., average particle diameter: 0.8 μm) as a matting agent, 5 parts by mass of Benton 38 (manufactured by Toshin Chemicals Co., Ltd.) as a filler sedimentation inhibitor, and 0.8 parts by mass of blue colorant (C.I. Pigment Blue 15: 3), 0.3 parts by mass of yellow colorant (C.I. Pigment Yellow 147), and 1.2 parts by mass of red colorant (Paliogen Red K3580 manufactured by BASF Japan Ltd.) as colorants were combined and mixed in advance using a stirring apparatus, and then kneaded using a three-roll mill, thereby preparing a curable resin composition.

[Preparation of Cured Coating Film]

A cured coating film was formed in the same manner as in Example 2 except that the curable resin composition obtained above and a transparent polyester film with a thickness of 25 μm (Lumirror #25-T60 manufactured by Toray Industries, Inc.) having no circular pattern were used. When the surface of the obtained cured coating film was visually confirmed, it had a good matte feeling.

Comparative Example 3

A cured coating film was formed in the same manner as in Example 3 except that the polyester film used in Comparative Example 1 was used as the supporting film. When the surface of the obtained cured coating film was visually confirmed, it had a glossy feeling and did not have a good matte feeling.

[Measurement of Gloss]

Gs (20°), Gs (60°), and Gs (85°) on the surface of the cured coating film were measured using a digital variable angle gloss meter (Micro-Tri-Gloss manufactured by BYK-Gardener Gmbh). The measurement results are as shown in Table 1 below.

[Evaluation of Scratch Visibility]

The following evaluation tests 1 and 2 were performed on the obtained cured coating films to evaluate the scratch visibility.

[Test 1]

A diamond pen was attached to the pencil hardness tester and a load of 50 g was set. Next, the pen tip was brought into contact with the cured coating film and moved at a constant speed to make scratches, and it was evaluated whether scratches could be visually recognized under a fluorescent lamp. The evaluation criteria were as follows:

⊚: Scratches are not visible.

○: Some scratches are visible (at a level that does not cause quality problems).

x: Scratches are visible throughout.

[Test 2]

The cured coating films were overlapped with each other and rubbed against each other while applying a load of 50 g to damage them, and it was evaluated whether the scratches could be visually recognized under a fluorescent lamp. The evaluation criteria were as follows:

○: Scratches are not visible.

x: Scratches are visible.

The evaluation results of tests 1 and 2 are as shown in Table 1 below.

TABLE 1

|  |  | Example 1 Dry film was used | Example 2 Curable resin composition was used | Example 3 Dry film was used | Comparative Example 1 Dry film was used | Comparative Example 2 Curable resin composition was used | Comparative Example 3 Dry film was used |
|---|---|---|---|---|---|---|---|
| Gloss | Gs (20°) | 2.6 | 3.4 | 0.2 | 76.4 | 1.2 | 79.2 |
|  | Gs (60°) | 15.2 | 19.8 | 2.6 | 91.3 | 8.0 | 93.1 |
|  | Gs (85°) | 53.2 | 57.2 | 27.8 | 99.0 | 30.6 | 99.6 |
| {Gs (85°)/Gs (60°)}/{Gs (60°)/Gs (20°)} |  | 0.60 | 0.50 | 0.82 | 0.90 | 4.73 | 0.91 |
| Evaluation of scratch visibility | Test 1 | ◎ | ◎ | ○ | X | X | X |
|  | Test 2 | ○ | ○ | ○ | ○ | X | ○ |

As is clear from the evaluation results in Table 1, the cured coating films (Examples 1 to 3), in which Gs (20°)≤5, Gs (85°)≥35, and the ratio R represented by R={Gs (85°)/Gs (60°)}/{Gs (60°)/Gs (20°)} is in a range of 0.35 to 4.0, have unnoticeable scratches while even having a matte feeling. Meanwhile, the cured coating films (Comparative Examples 1 to 3), in which Gs (85°)≥35 and the ratio R is in a range of 0.35 to 4.0 while Gs (20°) is more than 5, do not have a matte feeling and have noticeable scratches. In addition, the cured coating film (Comparative Example 2) in which Gs (85°) is less than 35 while Gs (20°)≤5 and the ratio R is outside a range of 0.35 to 4.0, have noticeable scratches while having a matte feeling.

The invention claimed is:

1. A cured coating film, obtained from a curable photosensitive resin composition comprising at least an alkali-soluble resin, a photopolymerizable monomer, and a photoinitiator and formed on a substrate,
    wherein the cured coating film has Gs (20°)≤5, Gs (85°) ≥35, and a ratio R represented by formula R={Gs (85°)/Gs (60°)}/{Gs (60°)/Gs (20°)} being 0.35 to 4.0, where Gs (20°), Gs (60°), and Gs (85°) are 20° gloss, 60° gloss, and 85° gloss on a surface of said cured coating film measured according to JIS Z 8741-1997, respectively.

2. The cured coating film according to claim 1, wherein the Gs (60°) is 2 to 30.

3. A solder resist layer of a printed wiring board, comprising: the cured coating film according to claim 1.

4. A solder resist layer of a printed wiring board, comprising: the cured coating film according to claim 2.

* * * * *